US011718905B2

(12) United States Patent
Kalkhoran et al.

(10) Patent No.: US 11,718,905 B2
(45) Date of Patent: Aug. 8, 2023

(54) FUNCTIONALLY INTEGRATED COATING STRUCTURES

(71) Applicant: TECHNETICS GROUP LLC, Charlotte, NC (US)

(72) Inventors: Nader Kalkhoran, Charlotte, NC (US); Eric Tobin, Charlotte, NC (US); Tim Egge, Charlotte, NC (US); Jason Burns, Charlotte, NC (US); Rick Oliver, Charlotte, NC (US); Angus McFadden, Charlotte, NC (US); Jason Wright, Charlotte, NC (US)

(73) Assignee: Technetics Group LLC, Charlotte, NC (US)

(*) Notice: Subject to any disclaimer, the term of this patent is extended or adjusted under 35 U.S.C. 154(b) by 658 days.

(21) Appl. No.: 16/624,233

(22) PCT Filed: May 30, 2018

(86) PCT No.: PCT/US2018/035001
§ 371 (c)(1),
(2) Date: Dec. 18, 2019

(87) PCT Pub. No.: WO2018/236559
PCT Pub. Date: Dec. 27, 2018

(65) Prior Publication Data
US 2020/0131619 A1  Apr. 30, 2020

Related U.S. Application Data

(60) Provisional application No. 62/521,811, filed on Jun. 19, 2017.

(51) Int. Cl.
*C23C 14/08* (2006.01)
*C23C 14/06* (2006.01)
(Continued)

(52) U.S. Cl.
CPC ........ *C23C 14/081* (2013.01); *C23C 14/0694* (2013.01); *C23C 14/083* (2013.01);
(Continued)

(58) Field of Classification Search
CPC ............................ C23C 14/221; C23C 14/568
See application file for complete search history.

(56) References Cited

U.S. PATENT DOCUMENTS 5,618,388 A * 4/1997 Seeser .................. C23C 14/083
204/192.12
5,643,423 A   7/1997 Kimock et al.
(Continued)

FOREIGN PATENT DOCUMENTS

WO   1993/016212 A1   8/1993
WO   2013/071255 A1   5/2013

OTHER PUBLICATIONS

PCT/US2018/038302 International Preliminary Report on Patentability dated Jan. 2, 2020, 5 pgs.
(Continued)

*Primary Examiner* — Alex A Rolland
(74) *Attorney, Agent, or Firm* — Perkins Coie LLP

(57) ABSTRACT

Techniques for depositing a functionally integrated coating structure on a substrate are provided. An example method according to the disclosure includes receiving the substrate into a process chamber of a multi-process ion beam assisted deposition system, disposing the substrate in a first zone including a first evaporator species and a first ion beam, wherein the first evaporator species is Aluminum Oxide (Al2O3), disposing the substrate in a second zone including a second evaporator species and a second ion beam, wherein the second evaporator species is Yttrium Oxide (Y2O3), and disposing the substrate in a third zone including a third evaporator species and a third ion beam, wherein the third evaporator species is Yttrium Fluoride (YF3).

5 Claims, 14 Drawing Sheets

(51) Int. Cl.
    *C23C 14/24*     (2006.01)
    *C23C 28/04*     (2006.01)
    *C23C 28/00*     (2006.01)
    *H01J 37/32*     (2006.01)
    *C23C 14/22*     (2006.01)

(52) U.S. Cl.
    CPC ............ *C23C 14/221* (2013.01); *C23C 14/24* (2013.01); *C23C 28/042* (2013.01); *C23C 28/42* (2013.01); *H01J 37/32477* (2013.01); *H01J 37/32715* (2013.01)

(56) References Cited

U.S. PATENT DOCUMENTS

| | | | |
|---|---|---|---|
| 6,527,866 B1 | 3/2003 | Matijasevic et al. | |
| 6,673,387 B1 * | 1/2004 | Zhang | C23C 8/02 427/126.3 |
| 6,921,741 B2 | 7/2005 | Arendt et al. | |
| 2003/0080085 A1 * | 5/2003 | Greenberg | A61K 9/0009 216/20 |
| 2003/0184219 A1 | 10/2003 | Duggal et al. | |
| 2006/0141291 A1 | 6/2006 | Foltyn et al. | |
| 2012/0288673 A1 | 11/2012 | Clemens et al. | |
| 2015/0311043 A1 * | 10/2015 | Sun | C23C 4/18 427/523 |

OTHER PUBLICATIONS

PCT/US2018/035001 International Preliminary Report on Patentability dated Jan. 2, 2020, 13 pgs.
PCT/US18/035001 International Search Report and Written Opinion dated Aug. 24, 2018, 13 pgs.
PCT/US18/038302 International Search Report and Written Opinion dated Aug. 23, 2018, 5 pgs.

* cited by examiner

570

| Coating System | Process 1 | | Process 2 | | Process 3 | |
|---|---|---|---|---|---|---|
| | Evap 1 | Ion 1 | Evap 2 | Ion 2 | Evap 3 | Ion 3 |
| 571 — $Al_2O_3/Y_2O_3/ZrO_2$ | $Al_2O_3$ 2 Å/s | Ar 100 µA/cm² 500eV | $Y_2O_3$ 2 Å/s | Ar 100 µA/cm² 500eV | $ZrO_2$ 2 Å/s | Ar 100 µA/cm² 500eV |
| 572 — $Al_2O_3/Y_2O_3/ZrO_2$ | All 3, one in each pocket 2 Å/s | Ar 90 µA/cm² 1000eV | All 3, one in each pocket 2 Å/s | Ar 90 µA/cm² 1000eV | All 3, one in each pocket 2 Å/s | Ar 90 µA/cm² 1000eV |
| 573 — $Y_2O_3/YF_3$ Or $Y_2O_3/Y_2O_3$:$YF_3$ | $Y_2O_3$ 5 Å/s | Ar 90 µA/cm² 500eV | $Y_2O_3$ 5 Å/s | Ar 90 µA/cm² 500eV | $YF_3$ 3 Å/s | Ar 90 µA/cm² 500eV |
| 574 — $Al_2O_3/Y_2O_3/YF_3$ | $Al_2O_3$ 2 Å/s | Ar 75 µA/cm² 500eV | $Y_2O_3$ 2 Å/s | Ar 75 µA/cm² 500eV | $YF_3$ 2 Å/s | Ar 75 µA/cm² 500eV |
| 575a — $Y_2O_3$ | Y 1 Å/s | O 120 µA/cm² 2000eV | Y 1 Å/s | O 120 µA/cm² 2000eV | Y 1 Å/s | O 120 µA/cm² 2000eV |
| 575b — $Y_2O_3$ | $Y_2O_3$ 10 Å/s | Ar 120 µA/cm² 2000eV | $Y_2O_3$ 10 Å/s | Ar 120 µA/cm² 2000eV | $Y_2O_3$ 10 Å/s | Ar 120 µA/cm² 2000eV |
| 576 — $Al_2O_3/Y_2O_3/YF_3$ | $Al_2O_3$ 2 -> 0 Å/s | Ar 100 µA/cm² 500eV | $Y_2O_3$ 0 -> 2 Å/s 2 -> 0 Å/s | Ar 100 µA/cm² 500eV | $YF_3$ 0 -> 2 Å/s | Ar 100 µA/cm 500eV |
| 577 — $Al_2O_3/Y_2O_3$ | $Al_2O_3$ 2 Å/s | Ar 50 µA/cm² 500eV | $Y_2O_3$ 10 Å/s | Ar 130 µA/cm² 500eV | $Y_2O_3$ 10 Å/s | B 20 µA/cm² 500eV |
| 578 — $Al_2O_3/ZrO_2$ | $Al_2O_3$ 5 Å/s | Ar 100 µA/cm² 1500eV | $ZrO_2$ 6 Å/s | Ar 120 µA/cm² 1500eV | $ZrO_2$ 6 Å/s | Ar 120 µA/cm² 1500eV |
| 579 — $Al_2O_3/ZrO_2$:$Y_2O_3$ | $Al_2O_3$ 2 Å/s | Ar 90 µA/cm² 500eV | $Y_2O_3$ 10 Å/s | Ar 150 µA/cm² 2000eV | $ZrO_2$ 0.5 Å/s | Ar 150 µA/cm² 2000eV |
| 580 — $Y_2O_3/YF_3/ZrO_2$:$Y_2O_3$ | $Y_2O_3$ 10 Å/s | Ar 150 µA/cm² 2000eV | $YF_3$ 6 Å/s | Ar 90 µA/cm² 1000eV | $ZrO_2$ 0.5 Å/s | Ar 150 µA/cm² 2000eV |

*FIG. 5C*

FUNCTIONALLY INTEGRATED COATING STRUCTURES

FIELD

This application is generally related to ion beam assisted deposition (IBAD), and more particularly to controlling a multi-stage deposition system to generate integrated coating structures.

BACKGROUND

Ceramic coatings may be used in a wide variety of industrial applications. A ceramic coating may be applied to metal surfaces of internal combustion engines and turbines to improve thermal resilience and reduce wear. They may also be used to protect parts in highly corrosive environments such as in semiconductor plasma processing equipment. In some applications, a ceramic coating may be added to worn metallic parts to bring the size dimensions of the parts back into acceptable tolerances. Thin coatings have typically been added to a metallic substrate with processes such as Physical Vapor Deposition (PVD), Chemical Vapor Deposition (CVD), Atomic Layer Deposition (ALD), Chemically Formed Processes (CFP), and other techniques. The composition of the coatings may vary from application to application. For example, coating materials such as silicon carbide, alumina, zirconia, titanium nitride, yttria, combinations of these materials and other composites may be used. The thickness and composition of coatings may vary significantly based on the intended application. Reconfiguring deposition equipment to generate application specific coatings may require substantial costs and engineering effort.

SUMMARY

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

An example of a method of depositing a functionally integrated coating structure on a substrate according to the disclosure includes receiving the substrate into a process chamber of a multi-process ion beam assisted deposition system, disposing the substrate in a first zone including a first evaporator species and a first ion beam, wherein the first evaporator species is Aluminum Oxide (Al2O3) at a deposition rate of between 1 and 10 angstroms per second and the first ion beam includes an Argon or Oxygen gas at an energy between 500 and 2000 electronvolts and a current density between 50 and 150 micro-amps per square centimeter, disposing the substrate in a second zone including a second evaporator species and a second ion beam, wherein the second evaporator species is Yttrium Oxide (Y2O3) at a deposition rate of between 1 and 10 angstroms per second and the second ion beam includes an Argon or Oxygen gas at an energy between 500 and 2000 electronvolts and a current density between 50 and 150 micro-amps per square centimeter, and disposing the substrate in a third zone including a third evaporator species and a third ion beam, wherein the third evaporator species is Yttrium Fluoride (YF3) at a deposition rate of between 1 and 10 angstroms per second and the third ion beam includes an Argon or Oxygen gas at an energy between 500 and 2000 electronvolts and a current density between 50 and 150 micro-amps per square centimeter.

Implementations of such a method may include one or more of the following features. The substrate may be output from the process chamber of the multi-process ion beam assisted deposition system after multiple orbits. The method may further include securing the second ion beam, disposing a second shutter assembly over the second evaporator species, wherein the second shutter assembly is configured to inhibit the evaporation of the second evaporator species, securing the third ion beam, disposing a third shutter assembly over the third evaporator species, wherein the third shutter assembly is configured to inhibit the evaporation of the third evaporator species, wherein disposing the substrate in the first zone, disposing the substrate in the second zone and disposing the substrate in the third zone includes orbiting the substrate for a plurality of consecutive orbits through each of the first zone, the second zone and the third zone. The method may also include activating the second ion beam, disposing the second shutter assembly away from the second evaporator species, wherein the second shutter assembly does not inhibit the evaporation of the second evaporator species, increasing the deposition rate in the second zone from zero angstroms per second to 1 to 10 angstroms per second, wherein the deposition rate in the second zone increases relative to the consecutive orbits of the substrate through the second zone, decreasing the deposition rate in the first zone from 1 to 10 angstroms per second to less than 0.1 angstroms per second, wherein the deposition rate in the first zone decreases relative to the consecutive orbits of the substrate through the first zone, securing the first ion beam, and disposing a first shutter assembly over the first evaporator species, wherein the first shutter assembly is configured to inhibit the evaporation of the first evaporator species. The method may further include activating the third ion beam, wherein disposing the third shutter assembly away from the third evaporator species, wherein the third shutter assembly does not inhibit the evaporation of the third evaporator species, increasing the deposition rate in the third zone from zero angstroms per second to 1 to 10 angstroms per second, wherein the deposition rate in the third zone increases relative to consecutive orbits of the substrate through the third zone, decreasing the deposition rate in the second zone from 1 to 10 angstroms per second to less than 0.1 angstroms per second, wherein the deposition rate in the second zone decreases relative to consecutive orbits of the substrate through the second zone, securing the second ion beam; and disposing the second shutter assembly over the second evaporator species to inhibit the evaporation of the second evaporator species. The method may further include securing the first ion beam, disposing a first shutter assembly over the first evaporator species, wherein the first shutter assembly is configured to inhibit the evaporation of the first evaporator species, activating the second ion beam, disposing the second shutter assembly away from the second evaporator species, wherein the second shutter assembly does not inhibit the evaporation of the second evaporator species, activating the third ion beam, disposing the third shutter assembly away from the third evaporator species, wherein the third shutter assembly does not inhibit the evaporation of the third evaporator species. The substrate may be an electrostatic chuck for a plasma processing chamber. An oxygen backfill gas may be provided to the process chamber.

An example of a process chamber for depositing a functionally integrated coating structure on a substrate according to the disclosure includes a first process zone including a first evaporator containing a first evaporator species and a first ion source configured to produce a first ion beam, wherein the first evaporator species is Aluminum Oxide ($Al_2O_3$) at a deposition rate of between 1 and 10 angstroms per second and the first ion beam includes an Argon or Oxygen gas at an energy between 500 and 2000 electronvolts and a current density between 50 and 150 micro-amps per square centimeter, a second process zone including a second evaporator containing a second evaporator species and a second ion source configured to produce a second ion beam, wherein the second evaporator species includes Yttrium Oxide ($Y_2O_3$) at a deposition rate of between 1 and 10 angstroms per second and the second ion beam includes an Argon or Oxygen gas at an energy between 500 and 2000 electronvolts and a current density between 50 and 150 micro-amps per square centimeter, and a third process zone including a third evaporator containing a third evaporator species and third ion source configured to produce a third ion beam, wherein the third evaporator species is Zirconium Oxide ($ZrO_2$) at a deposition rate between 1 and 10 angstroms per second and the third ion beam includes an Argon or Oxygen gas at an energy between 500 and 2000 electronvolts and a current density between 50 and 150 micro-amps per square centimeter.

Implementations of such a process chamber may include one or more of the following features. A substrate handler may be configured to sequentially orbit the substrate through the first process zone, the second process zone, and the third process zone. The substrate handler may be configured to rotate about a first axis such that the substrate may pass sequentially through the first process zone, the second process zone, and the third process zone. The substrate handler may include at least one substrate holder configured to rotate about a holder axis that is different from the first axis. The process chamber may further include a first shutter assembly configured to either allow or inhibit the evaporation of the first evaporator species, a second shutter assembly configured to either allow or inhibit the evaporation of the second evaporator species, and a third shutter assembly configured to either allow or inhibit the evaporation of the third evaporator species. The first shutter assembly is configured to allow the evaporation of the first evaporator species, the second shutter assembly is configured to inhibit the evaporation of the second evaporator species, and the third shutter assembly is configured to inhibit the evaporation of the third evaporator species. The first shutter assembly may be configured to inhibit the evaporation of the first evaporator species, the second shutter assembly may be configured to allow the evaporation of the second evaporator species, and the third shutter assembly may be configured to inhibit the evaporation of the third evaporator species. The first shutter assembly may be configured to inhibit the evaporation of the first evaporator species, the second shutter assembly may be configured to inhibit the evaporation of the second evaporator species, and the third shutter assembly may be configured to allow the evaporation of the third evaporator species. The first shutter assembly may be configured to inhibit the evaporation of the first evaporator species, the second shutter assembly may be configured to allow the evaporation of the second evaporator species, and the third shutter assembly may be configured to allow the evaporation of the third evaporator species.

An example of an apparatus for depositing a functionally integrated coating structure on a substrate according to the disclosure includes means for receiving the substrate into a process chamber of a multi-process ion beam assisted deposition system, means for disposing the substrate in a first zone including a first evaporator species and a first ion beam, wherein the first evaporator species is Aluminum Oxide ($Al_2O_3$) at a deposition rate between 1 and 10 angstroms per second and the first ion beam includes an Argon or Oxygen gas at an energy between 500 and 2000 electronvolts and a current density between 50 and 150 micro-amps per square centimeter, means for disposing the substrate in a second zone including a second evaporator species and a second ion beam, wherein the second evaporator species includes Yttrium Oxide ($Y_2O_3$) at a deposition rate of between 1 and 10 angstroms per second and the second ion beam includes an Argon or Oxygen gas at an energy between 500 and 2000 electronvolts and a current density between 50 and 150 micro-amps per square centimeter, means for disposing the substrate in a third zone including a third evaporator species and a third ion beam, wherein the third evaporator species is Zirconium Oxide ($ZrO_2$) at a deposition rate of between 1 and 10 angstroms per second and the third ion beam includes an Argon or Oxygen gas at an energy between 500 and 2000 electronvolts and a current density between 50 and 150 micro-amps per square centimeter; and means for outputting the substrate from the process chamber of the multi-process ion beam assisted deposition system.

An example of a process chamber for depositing a functionally integrated coating structure on a substrate according to the disclosure includes a first process zone including a first evaporator containing a first evaporator species and a first ion source configured to produce a first ion beam, wherein the first evaporator species is Aluminum Oxide ($Al_2O_3$) at a deposition rate of between 1 and 10 angstroms per second and the first ion beam includes an Argon or Oxygen gas at an energy between 500 and 2000 electronvolts and a current density between 50 and 150 micro-amps per square centimeter, a second process zone including a second evaporator containing a second evaporator species and a second ion source configured to produce a second ion beam, wherein the second evaporator species includes Yttrium Oxide ($Y_2O_3$) at a deposition rate of between 1 and 10 angstroms per second and the second ion beam includes an Argon or Oxygen gas at an energy between 500 and 2000 electronvolts and a current density between 50 and 150 micro-amps per square centimeter, and a third process zone including a third evaporator containing a third evaporator species and third ion source configured to produce a third ion beam, wherein the third evaporator species is Yttrium Oxide ($Y_2O_3$) at a deposition rate between 1 and 10 angstroms per second and the third ion beam includes a gas with an Argon or Oxygen gas at an energy between 500 and 2000 electronvolts and a current density between 20 and 150 micro-amps per square centimeter.

Implementations of such a process chamber may include one or more of the following features. A substrate handler configured to sequentially orbit the substrate through the first process zone, the second process zone, and the third process zone. A first shutter assembly configured to either allow or inhibit the evaporation of the first evaporator species, a second shutter assembly configured to either allow or inhibit the evaporation of the second evaporator species, and a third shutter assembly configured to either allow or inhibit the evaporation of the third evaporator species. The first shutter assembly may be configured to allow the evaporation of the first evaporator species, the second shutter assembly may be configured to inhibit the evaporation of the second evaporator species, and the third shutter assembly may be configured to inhibit the evaporation of the third evaporator species. The first shutter assembly may be configured to inhibit the evaporation of the first evaporator species, the second shutter assembly may be configured to allow the evaporation of the second evaporator species, and the third shutter assembly may be configured to allow the evaporation of the third evaporator species. A boron dopant may be mixed into the third ion beam gas. A boron dopant may be introduced via a backfill gas to the process chamber.

An example of a process chamber for depositing a functionally integrated coating structure on a substrate according to the disclosure includes a first process zone including a first multi-pocket evaporator containing one or more of a first set of evaporator species selected from among Aluminum Oxide (Al2O3), Yttrium Oxide (Y2O3), Yttrium Fluoride (YF3), and Zirconium Oxide (ZrO2), whereby one of the species is deposited at a rate of between 1 and 10 angstroms per second, and a first ion source configured to produce a first ion beam, which includes an Argon or Oxygen gas at an energy between 500 and 2000 electronvolts and a current density between 50 and 150 micro-amps per square centimeter, a second process zone including a second multi-pocket evaporator containing one or more of a second set of evaporator species selected from among Aluminum Oxide (Al2O3), Yttrium Oxide (Y2O3), Yttrium Fluoride (YF3), and Zirconium Oxide (ZrO2), whereby one of the species is deposited at a rate of between 1 and 10 angstroms per second, and a second ion source configured to produce a second ion beam, which includes an Argon or Oxygen gas at an energy between 500 and 2000 electronvolts and a current density between 50 and 150 micro-amps per square centimeter, and a third process zone including a third multi-pocket evaporator containing one or more of a third set of evaporator species selected from among Aluminum Oxide (Al2O3), Yttrium Oxide (Y2O3), Yttrium Fluoride (YF3), and Zirconium Oxide (ZrO2), whereby one of the species is deposited at a time at a rate of between 1 and 10 angstroms per second, and a third ion source configured to produce a third ion beam, which includes an Argon or Oxygen gas at an energy between 500 and 2000 electronvolts and a current density between 50 and 150 micro-amps per square centimeter.

Implementations of such a process chamber may include one or more of the following features. A first shutter assembly may be configured to either allow or inhibit the evaporation of one of the evaporator species selected from among the first set of evaporator species, a second shutter assembly may be configured to either allow or inhibit the evaporation of one of the evaporator species selected from among the second set of evaporator species, and a third shutter assembly may be configured to either allow or inhibit the evaporation of one of the evaporator species selected from among the third set of evaporator species. A mass flow controller may be configured to provide an oxygen backfill gas to the process chamber. A substrate handler may be configured to sequentially orbit the substrate through the first process zone, the second process zone, and the third process zone. The substrate handler may be configured to rotate about a first axis such that the substrate may pass sequentially through the first process zone, the second process zone, and the third process zone. The substrate handler may include at least one substrate holder configured to rotate about a holder axis that is different from the first axis.

An example of a method of depositing a functionally integrated coating structure on a substrate according to the disclosure includes receiving the substrate into a process chamber of a multi-process ion beam assisted deposition system, disposing the substrate in a first zone including a first evaporator species and a first ion beam, wherein the first evaporator species is selected from among Aluminum Oxide (Al2O3), Yttrium Oxide (Y2O3), Yttrium Fluoride (YF3), and Zirconium Oxide (ZrO2), Aluminum Oxide (Al2O3) deposited at a rate of between 1 and 10 angstroms per second, and the first ion beam includes an Argon or Oxygen gas at an energy between 500 and 2000 electronvolts and a current density between 50 and 150 micro-amps per square centimeter, disposing the substrate in a second zone including a second evaporator species and a second ion beam, wherein the second evaporator species is selected from among Aluminum Oxide (Al2O3), Yttrium Oxide (Y2O3), Yttrium Fluoride (YF3), and Zirconium Oxide (ZrO2), Aluminum Oxide (Al2O3) deposited at a rate of between 1 and 10 angstroms per second, and the second ion beam includes an Argon or Oxygen gas at an energy between 500 and 2000 electronvolts and a current density between 50 and 150 micro-amps per square centimeter, disposing the substrate in a third zone including a third evaporator species and a third ion beam, wherein the third evaporator species is selected from among Aluminum Oxide (Al2O3), Yttrium Oxide (Y2O3), Yttrium Fluoride (YF3), and Zirconium Oxide (ZrO2), Aluminum Oxide (Al2O3) deposited at a rate of between 1 and 10 angstroms per second, and the third ion beam includes an Argon or Oxygen gas at an energy between 500 and 2000 electronvolts and a current density between 50 and 150 micro-amps per square centimeter, and orbiting the substrate for a plurality of passes through each of the first zone, the second zone and the third zone.

Implementations of such a method may include one or more of the following features. The substrate may be outputted from the process chamber of the multi-process ion beam assisted deposition system. The method may further include securing the second ion beam, disposing a second shutter assembly over the second evaporator species, wherein the second shutter assembly is configured to inhibit the evaporation of the second evaporator species, securing the third ion beam, disposing a third shutter assembly over the third evaporator species, wherein the third shutter assembly is configured to inhibit the evaporation of the third evaporator species, wherein disposing the substrate in the first zone, disposing the substrate in the second zone and disposing the substrate in the third zone includes orbiting the substrate for a plurality of consecutive passes through each of the first zone, the second zone and the third zone. The method may further include activating the second ion beam, disposing the second shutter assembly away from the second evaporator species, wherein the second shutter assembly does not inhibit the evaporation of the second evaporator species, increasing the deposition rate in the second zone from zero angstroms per second to 1 to 10 angstroms per second, wherein the deposition rate in the second zone increases relative to the consecutive orbits of the substrate through the second zone, decreasing the deposition rate in the first zone from 1 to 10 angstroms per second to less than 0.1 angstroms per second, wherein the deposition rate in the first zone decreases relative to consecutive orbits of the substrate through the first zone, securing the first ion beam, and disposing a first shutter assembly over the first evaporator species, wherein the first shutter assembly is configured to inhibit the evaporation of the first evaporator species. The method may further include activating the third ion beam, disposing the third shutter assembly away from the third evaporator species, wherein the third shutter assembly does not inhibit the evaporation of the third evaporator species, increasing the deposition rate in the third zone from zero angstroms per second to 1 to 10 angstroms per second, wherein the deposition rate in the third zone increases relative to consecutive orbits of the substrate through the third zone, decreasing the deposition rate in the second zone from 1 to 10 angstroms per second to less than 0.1 angstroms per second, wherein the deposition rate in the second zone decreases relative to consecutive orbits of the substrate through the second zone, securing the second ion beam; and disposing the second shutter assembly over the second evaporator species to inhibit the evaporation of the second evaporator species. The method may further include securing the first ion beam, disposing a first shutter assembly over the first evaporator species, wherein the first shutter assembly is configured to inhibit the evaporation of the first evaporator species, activating the second ion beam, disposing the second shutter assembly away from the second evaporator species, wherein the second shutter assembly does not inhibit the evaporation of the second evaporator species, activating the third ion beam, disposing the third shutter assembly away from the third evaporator species, wherein the third shutter assembly does not inhibit the evaporation of the third evaporator species. The substrate may be an electrostatic chuck for a plasma processing chamber. An oxygen backfill gas may be provided to the process chamber.

Items and/or techniques described herein may provide one or more of the following capabilities, as well as other capabilities not mentioned. A substrate may be placed in a multi-process ion assisted deposition chamber. A process zone may include an evaporator species and an ion beam configuration. Each of the processes zones may be selectively activated for deposition. The substrate may orbit sequentially through each process zone for multiple passes. A process zone may include a multi-species evaporator unit. The deposition rates in one or more zones may be varied simultaneously. Other capabilities may be provided and not every implementation according to the disclosure must provide any, let alone all, of the capabilities discussed. Further, it may be possible for an effect noted above to be achieved by means other than that noted and a noted item/technique may not necessarily yield the noted effect.

Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTIONS OF THE DRAWINGS

FIG. 5C is an example table of coating structures generated by a multi-process beam assisted deposition system.

DETAILED DESCRIPTION

Techniques for generating functional integrated coating structures on substrates are provided. The techniques discussed below are exemplary, however, and not limiting of the invention as other implementations in accordance with the disclosure are possible.

Figure 1:
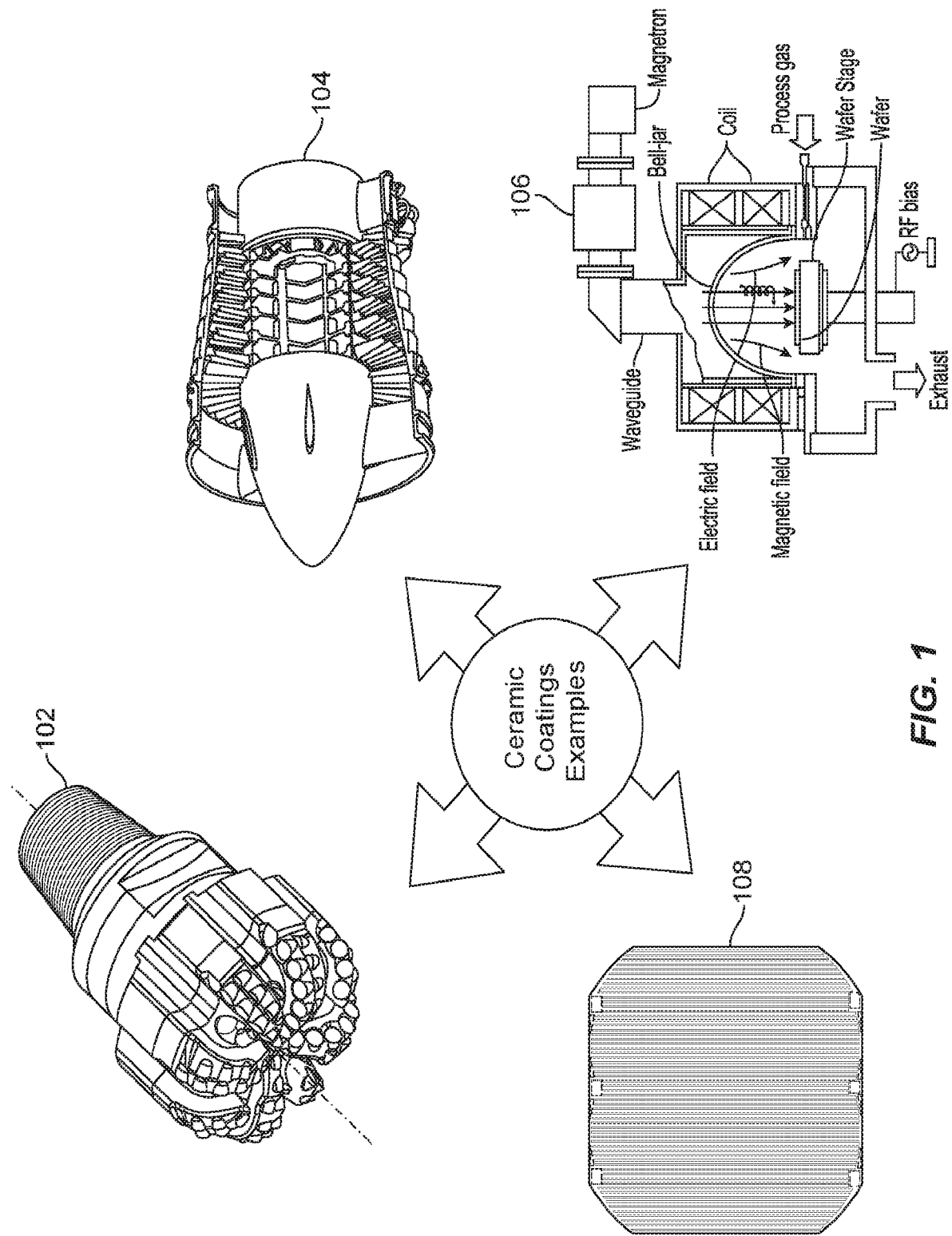
FIG. 1 is an illustration of example applications utilizing ceramic coatings.

Referring to FIG. 1, examples of applications utilizing ceramic coatings are shown. The examples include an oil well drill bit 102, a jet engine 104, a semiconductor plasma processing system 106, and a solar array 108. These applications are examples only and are not limitations. The example applications are provided to highlight the wide range of potential uses for functionally integrated coating structures. The oil well drill bit 102 is an example of a high wear application. A ceramic coating may be added to the drill bit 102 to increase durability and reduce the downtime associated with replacing a drill bit. Prior art examples of ceramic coatings for high wear applications include formations of Aluminum Oxide (Al2O3) and Titanium Nitride (TiN). High temperature applications, such as the jet engine 104, rocket engines and internal combustion engines, may use a ceramic thermal barrier coating (TBC) to improve the durability of the engine parts. For example, turbine blades may be coated with Al2O3 and an aluminide such as Nickel Aluminide (NiAl or Ni2Al3). The plasma processing system 106 is an example of ceramic coatings for harsh environments. A plasma processing chamber may utilize ceramic coatings such as Yttrium Oxide (Y2O3) on system components that are exposed to the plasma source. For example, wafer handling components such as an electrostatic chuck (ESC), and other plasma process chamber components such as windows, feedthroughs and rotational components may receive a ceramic coating as part of the manufacturing process. The solar array 108 may utilize a ceramic coating such as Silicone Dioxide (SiO2) to improve the durability and weather resistance of a solar installation. The diversity of applications and coatings depicted in FIG. 1 are examples only and are provided to establish a basis for functional specific coatings. Research for new ceramic coatings for existing and new industrial applications continues. For example, Yttria-stabilized zirconia (YSZ) membranes have been widely used as solid-state electrolytes for a range of applications because of their high oxide ion conductivity and good stability. However, high operating temperatures of about 1000° C. limit further expansion of applications due to thermal stresses and rapid degradation. For this reason, extensive research has been conducted to reduce electrolyte resistance at reduced temperatures, for example, by replacing traditional YSZ with other materials such as zirconia-stabilized yttria (with the main component of the ceramic being yttria rather than zirconia) that show higher oxide ion conductivity or by reducing the thickness of the electrolyte to lower ohmic losses. Other ceramic structures have been integrated based on application needs. Such research and development efforts, and the subsequent manufacturing requirements, provide a need for the functional integrated coating structures and systems described herein.

Figure 2:
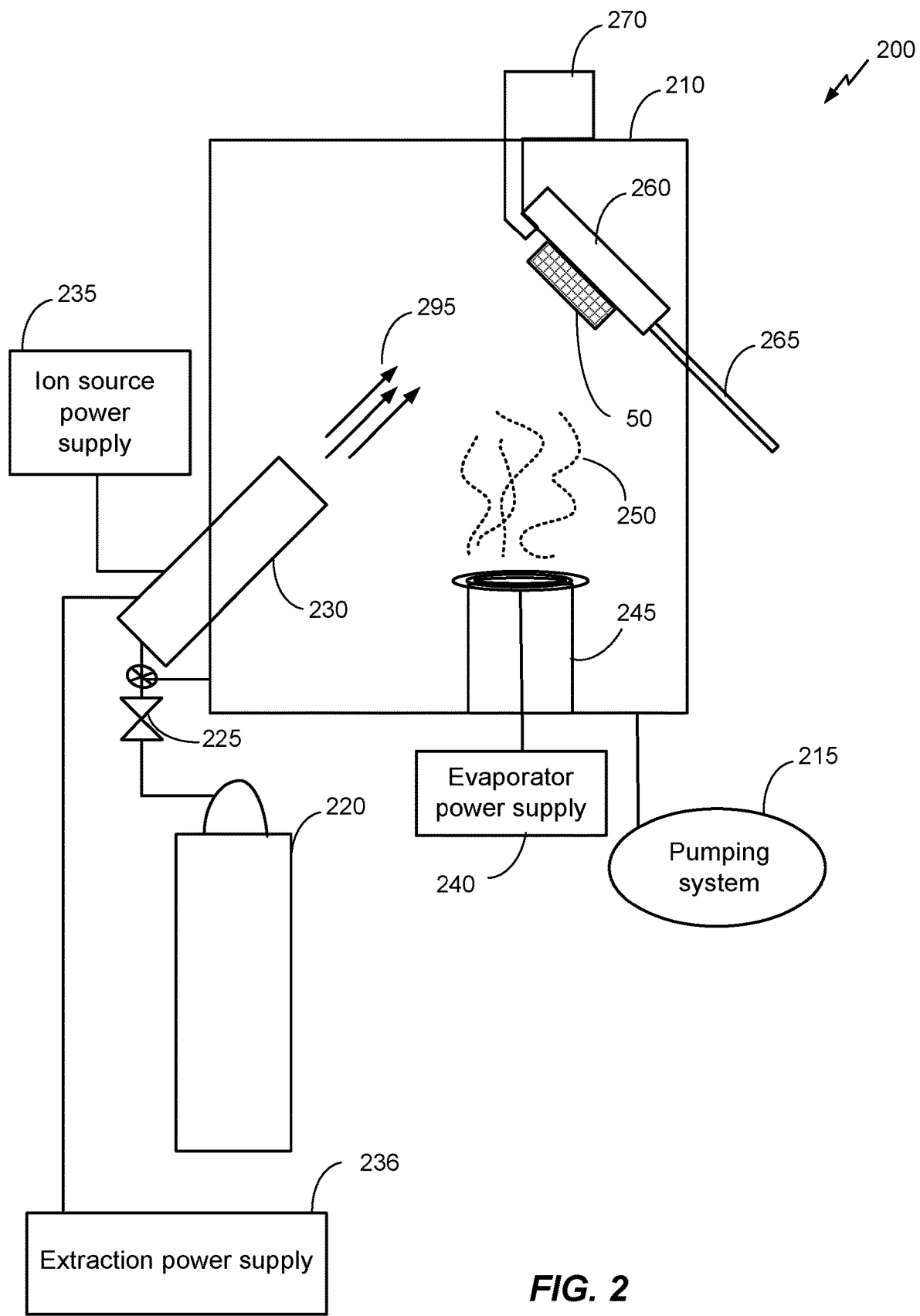
FIG. 2 is a schematic diagram of an example of an ion beam assisted deposition (IBAD) system.

Referring to FIG. 2, a schematic diagram of an example system 200 with a processing chamber for an ion beam assisted deposition (IBAD) process is shown. The system 200 is an example of a single beam IBAD process known in the art. The system 200 is an example and not limiting and may be altered, e.g., by having components added, removed, or rearranged. The system 200 includes a processing chamber 210, a pumping system 215 and a gas supply source 220. The gas supply source 220 is coupled to a mass flow controller 225 and an ion source 230. The mass flow controller may provide gases to the processing chamber 210 at or below a flow rate of 100 standard cubic centimeters per minute (SCCM) flow rate. The gas supply source 220 is configured to supply one or more gases (e.g., Ar, Ne, Xe, He, O, N, etc.) to the ion source 230 and/or the processing chamber 210. The gas supply source 220 may be configured to supply the one or more gases as a backfill gas. The ion source may be a bucket type ion source or any other suitable ion source. A mass flow controller 225 regulates the rate of flow of the one or more gases from the gas supply source 220 to the ion source 230. An ion source power supply 235 maintains an arc discharge between the anode and the filaments and an extraction power supply 236 and is configured to accelerate the ions through one or more accelerator grids of the ion source 230. The accelerated ions form an ion beam 295. The ion beam energy may be 50-5000 electronvolts (eV). The extraction power supply 236 determines the ion beam energy and may determine the arrival rate of the ion beam. The ion source power supply and/or the mass flow controller may determine the arrival rate of the ion beam 295. The ion beam 295 may include one or more gas species.

An evaporator 245 also is mounted in the processing chamber 210 in operative association with the ion source 230. The evaporator 245 may be an electron beam evaporator or a thermal evaporator operably coupled to an evaporator power supply 240. The evaporator 245 is designed to vaporize particular metallic or ceramic evaporants (e.g., vapor plume 250) so as to dry-coat a specific substrate 50 therewith, being assisted in the dry-coating by an ion beam 295 emanating from the ion source 230. Metallic and ceramic evaporants may include Ti and its respective alloys, oxides and compounds. For example, Ti for evaporation may be 99.8% pure in 6 mm pellets, and titania may be 99.9% pure, in 3-6 mm pellets. The evaporator 245 may include one or more evaporant sources with each evaporant source configured to include one metallic or ceramic evaporant. Further, the process chamber may include more than one evaporator 245 in which the evaporators may be configured to co-evaporate multiple materials and produce the vapor plume 250 including one or more materials, or to produce multiple vapor plumes 250 containing one or more materials. In this case, two or more materials may be co-deposited (i.e., deposited concurrently) onto the substrate 50. For electron beam evaporators, an electron beam current of the evaporator 245 determines a deposition rate for the metallic or ceramic evaporants. The deposition rate of each material may be independently controlled so that each species of multiple materials may have a respective deposition rate. In this way, one or more materials may be added to the vapor plume or plumes 250 and varying deposition rates of the various materials may be provided. During co-deposition, the ratio of the multiple materials in the vapor plume 250 may be the same throughout the deposition process or may change. For example, the vapor plume(s) 250 may include more of a particular material than the other materials and the ratio between materials may be selected and controlled as a processing parameter.

The substrate 50 is provided in the processing chamber 210 with the aid of a suitable substrate holder 260. Preferably, the substrate holder 260 is mounted for both rotational and translational motion on a shaft 265. The substrate holder 260 may be a double-planetary fixture. This type of fixture rotates its components around two parallel axes, while simultaneously translating through the treatment zone. This may allow control of and optimization of packing density and coating uniformity for the deposited film. In an embodiment, the substrate holder 260 may be configured as a heat source or heat sink for the substrate. For example, the substrate holder may include a cooling system, such as a water cooling system. The system 200 may include a thickness monitor 270 in operative association with the evaporator 245 or the substrate holder 260 to monitor the thickness of the film being deposited on the substrate 50 during operation of the system 200. Such monitor 270 may be placed at any convenient location within the processing chamber 210.

In general, the IBAD process includes a number of parameters, each of which can influence the properties of the film deposited on the substrate surface. A control system including one or more computers and the corresponding software may be operably coupled to the system 200 and configured to control these parameters. Some of these parameters include evaporant deposition rate, electron beam current, arrival rate or current density of the ion beam, ion species, ion beam energy, backfill species, and backfill flow rate. Evaporant deposition rates can vary from about 0.1 Angstroms per second (Å/s) to approximately 100 Å/s. The electron beam current is controlled via a feedback loop with the thickness monitor 270 and adjusted based on the desired deposition rate. The arrival rate of the ion beam can be in a range between about 10 to about 500 microamperes per square centimeter per second (µA/cm2/sec). The ion species may be one or more ionized noble gases, for example, Ar, Xe, Ne, He, etc. and/or one or more reactive gases, for example, O, N, etc. The ion beam energy may be 50 electronvolts (eV) to about 5000 eV. The backfill species may be one or more reactive gases, for example, oxygen and/or nitrogen. The backfill flow rate may be ≤100 SCCM. Additionally, the crystal grain size (e.g., an average crystal grain size or a maximum crystal grain size) of the deposited film may be a function of the ion beam parameters.

Figure 3:
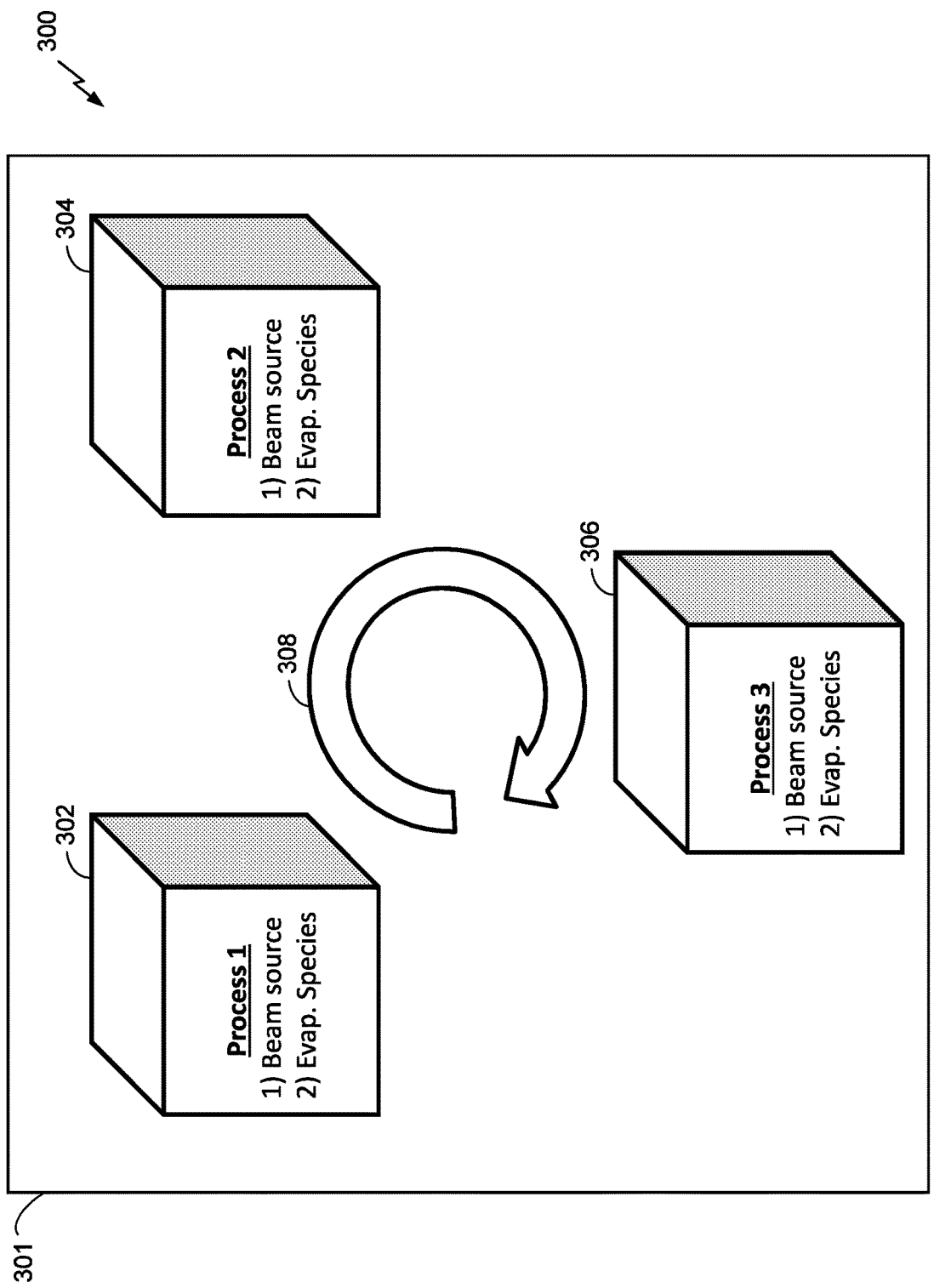
FIG. 3 is a conceptual diagram of a multi-process ion beam assisted deposition for generating functionally integrated coating structures.

Referring to FIG. 3, a conceptual diagram 300 of a multi-process ion beam assisted deposition for generating functionally integrated coating structures is shown. The diagram 300 depicts a single process chamber 301 including three different process zones. The number of deposition zones could be less than or greater than 3. Each of the process zones may be configured to perform an IBAD process as described in FIG. 2. For example, the process chamber 301 is configured to simultaneously perform a first process 302, a second process 304, and a third process 306. A process flow indicator 308 illustrates how a workpiece (e.g., substrate) may sequentially flow through the processes 302, 304, 306. Each process 302, 304, 306 may be characterized by a beam source and an evaporator species. The beam sources may be based on one or more supply gases (e.g., Ar, Ne, Xe, He, 0, N, etc.) provided to an ion source. The evaporator species is an indication of one or more metallic and/or ceramic evaporants contained in a respective evaporator. For example, the evaporator species for process 1 may be Al2O3, while the evaporator for process 2 includes Y2O3, and process 3 includes ZrO2. In an example, each of the process evaporators may include multiple species (e.g., multi-pocket evaporators). The variations of beam source and evaporator species are not limited. In an example, the first process 302 and the second process 304 may have similar beam source and evaporator species and the third process 306 may have different beam source and/or evaporator species. Other combinations within the first, second and third processes 302, 304, 306 are also possible. In operation, a substrate may be disposed in the process chamber 301 and then follow the process flow indicator 308 sequentially to receive the respective coatings for each of processes 302, 304, 306. A substrate may make repeated orbits within the process chamber 301 to receive multiple coatings based on each of the processes 302, 304, 306. In an example, one or more of the processes 302, 304, 306 may be shuttered and the ion beam secured (e.g., powered down) to vary the deposition order on the substrate. For example, when all processes 302, 304, 306 are open, the deposition order on a substrate may be 1-2-3-1-2-3-1-2-3 etc. . . . such that '1' represents a deposition based on the first process 302, '2' represents a deposition based on the second process 304, and '3' represents a deposition based on the third process 306. When one or more of the processes are alternatively shuttered and opened, the resulting deposition layers may be re-ordered. As examples, the various permutations of the first, second and third processes may include 1-2-2-2-2-3, 1-1-2-3-3, 1-2-2-3-2-2-3-3, etc.

The resulting deposition layers may be further altered with the use of multi-species pots (e.g., multi-pocket evaporators) in one or more of the processes. For example, each of the three processes may contain an evaporator with three pots, Pots A, B, and C. For each process evaporator, Pot A is loaded with Material A, Pot B is loaded with Material B, and Pot C is loaded with Material C. For the first part of the coating deposition, each evaporator utilizes Pot A, and is thus evaporating Material A. Each evaporator then switches to Pot B and evaporates Material B for the next stage of coating deposition. For the final stage of deposition, each evaporator switches to Pot C and evaporates Material C. Thus, the deposition order is: Stage 1: 1-2-3-1-2-3-1-2-3, etc.; Stage 2: 1-2-3-1-2-3-1-2-3, etc., Stage 3: 1-2-3-1-2-3-1-2-3, etc. The resulting coating is a three-layer structure consisting of Material A/Material B/Material C.

In the case where two or more of the processes are depositing a different material, the relative evaporation rates and transport speed of the substrate holder 260 may be increased or decreased to influence whether a coating consists of thin, alternating layers or a mixture of the materials. For instance if Material A is being deposited in Process 1 and Material B is being deposited in Process 2, and if the deposition rate is high for each process and the transport speed of the substrate holder is slow, the resulting film will consist of thin alternating layers of Material A and Material B. If the deposition rate is low for each process and the transport speed of the substrate holder is fast, the resulting film will consist of a more homogeneous mixture of Material A and Material B, because the ion bombardment has sufficient energy to intermix the thin film layers as they are being deposited.

Figure 4:
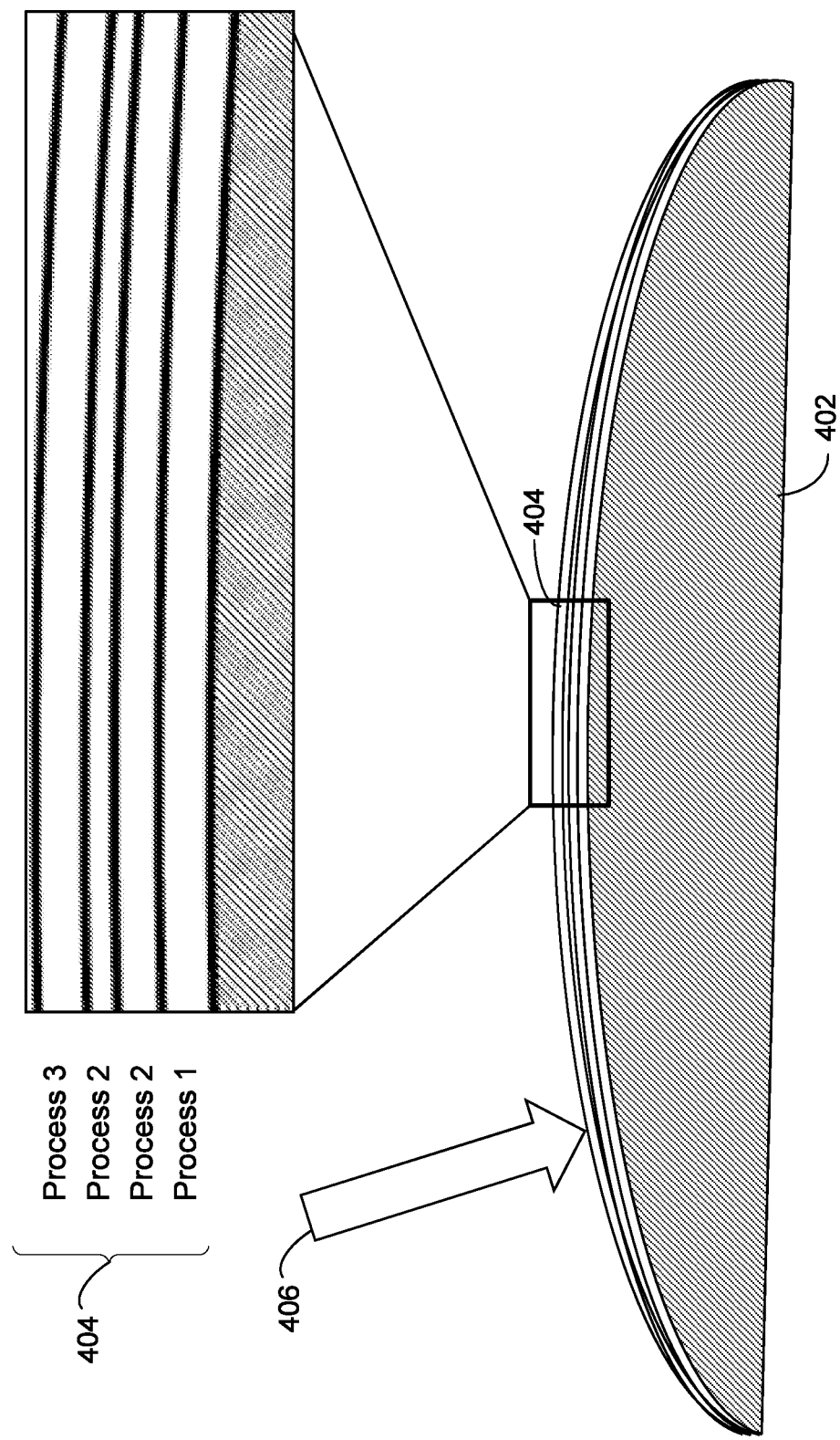
FIG. 4 is an illustration of a multilayer ceramic coating.

Referring to FIG. 4, with further reference to FIGS. 1-3, an example of a substrate 402 with a multilayer coating 404 is shown. In an example, the substrate 402 may be a surface of the drill bit 102, a blade from the jet turbine 104, an ESC from the plasma processing system 106, and/or another appropriate substrate in a ceramic coating application. The multilayer coating 404 includes one or more layers based on the processes 302, 304, 306 depicted in FIG. 3. The dimensions, composition and number of layers are exemplary only and may vary based on the application. The multilayer coating 404 may be used to protect the substrate 402 from an outside force 406. As examples, and not limitations, the outside force 406 may represent physical stress (e.g., friction, pressure), thermal stress (e.g., high temperature), chemical stress (e.g., corrosive materials), and/or electrical stress (e.g., high voltage). Ceramic coatings may be used to protect the substrate 402 from other outside forces. The construction of the layers, and the corresponding processes, may be varied based on the outside forces associated with an application. In an example, a large number of layers (e.g., 21-42 layers) may be used to replace substrate material that has worn away during operational use (e.g., to bring the substrate back into mechanical tolerances). The multilayer coating 404 includes a first layer based on the first process 302, a second and a third layer based on the second process 304, and a fourth layer based on the third process 306. The order and composition of the layers may be designed to improve the functionality of the integrated coating. For example, the first process 302 may have improved adherence properties for a particular substrate, the second process 304 may have improved thermal or electrical properties, and the third process 306 may have improved corrosion resistance properties. Each of the processes may produce a coating which individually provides functional benefits and the combination of processes provides a functionally integrated coating.

Figure 5A:
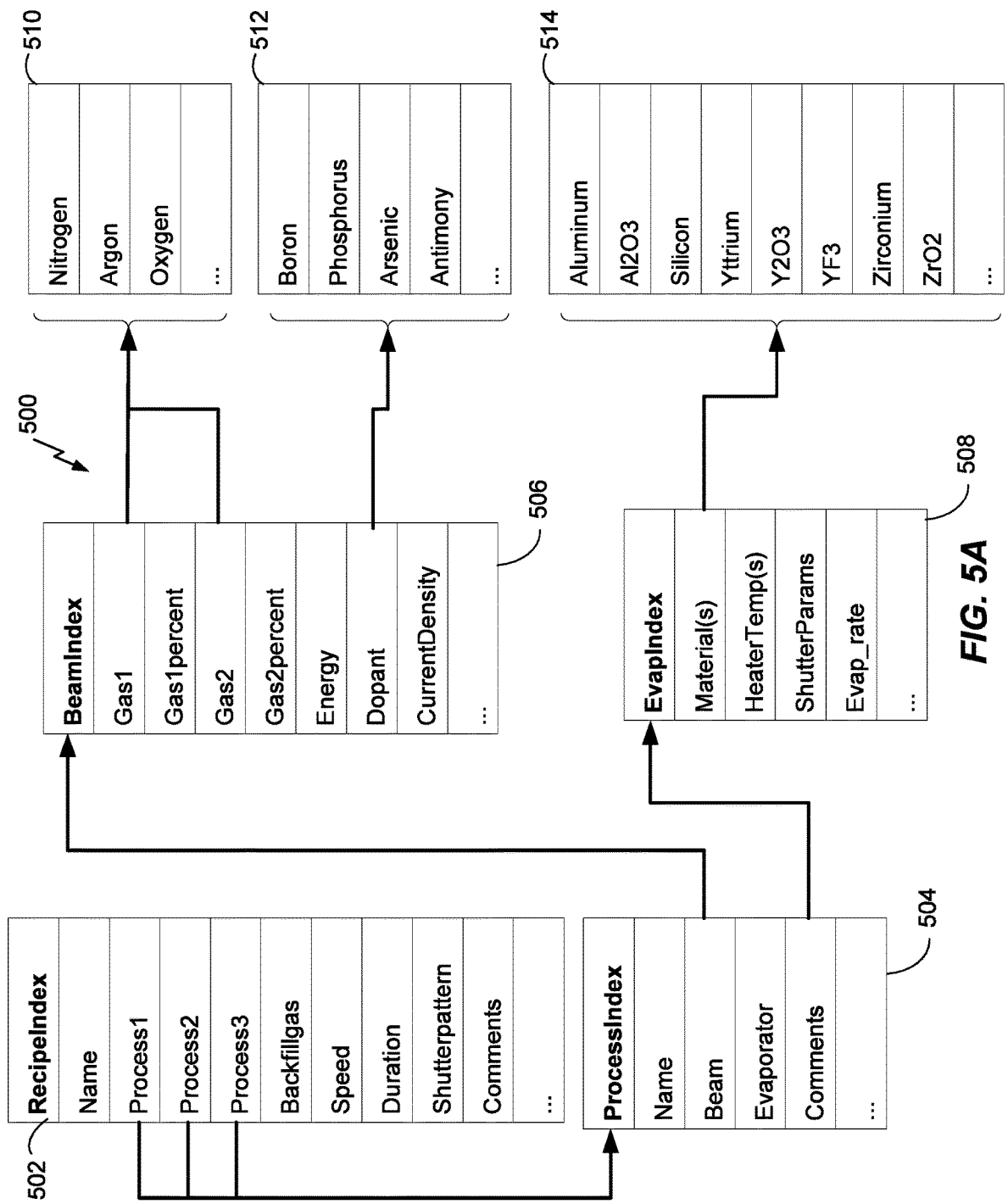
FIG. 5A is an example data structure for a multi-process ion beam assisted deposition system.

Referring to FIG. 5A, with further reference to FIGS. 2-4, an example data structure 500 for a multi-process ion beam deposition system is shown. The data structure 500 may persist in a computer-readable storage medium such as a relational database (e.g., Oracle®, Microsoft SQL Server, SAP Hana®) or in one or more flat files (e.g., XML, text files). The data structure 500 may include one or more data tables such as a recipe table 502, a process table 504, a beam table 506 and an evaporator table 508. Other data tables or field lists may be used to define functional parameters for a variety of ceramic coating processes. For example, a beam gas table 510 and a dopant table 512 may be used to define an ion beam for an IBAD process. A species table 514 may be used to define potential evaporants for use in the processes 302, 304, 306. The recipe table 502 may include data fields such as a recipe index field to uniquely identify the recipe within the data structure 500 and a name field to provide identification information about a recipe to a user (e.g., a text field to name a recipe). Each record in the recipe table 502 may include multiple process parameters associated with each of the first, second and third processes 302, 304, 306. The recipe table 502 may include linking fields to the process table 504 to specify the beam source, energy and evaporator species requirements for the respective processes. The recipe table 502 may also include a back fill gas field to identify parameters associated with a back fill gas in the process chamber 301. Substrate handling parameters such as speed and duration fields may be used to characterize the motion of a substrate within the process chamber 301. One or more shutter pattern fields may be used to describe the opening and shuttering of evaporator pots within each of the process zones. The list of fields in the recipe table 502 is exemplary only and not a limitation as other recipe related information may also persist in the data structure 500.

The process table 504 may be used to configure the parameters associated with each of the process zones within the chamber 301. For example, each record in the process table 504 may have a process index to uniquely identify the record and a name field to identify the record to a user. A beam field may provide a link to the beam table 506 to identify the parameters for an ion beam. For example, the beam table 506 may include fields to configure one or more controllers to open mass flow valves to allow one or more gases into an ion source. Source gases may include nitrogen, argon, oxygen, and other gases as identified in the list of beam gases 510. An ion beam may optionally include a dopant such as boron, phosphorus, arsenic, antimony and other dopants as included in the dopant table 512. In an example, the dopant may be introduced to the process chamber via the backfill gas. A record in the beam table 506 may also include energy information to indicate the extraction voltage for the respective ion beam (e.g., 50-5000 eV). An evaporator field may be used to characterize the evaporator settings within a process zone. For example, the evaporator field may be a link to the evaporator table 508 to identify species, heater temperatures and shutter parameters. An evaporator may be configured with one or more pots containing one or more metallic or ceramic species such as aluminum, aluminum oxide, carbon, erbium, gallium, silicon, titanium, yttrium, yttrium oxide, yttrium fluoride, zirconium, zirconium oxide, and other species identified in the species table 514. The shutter parameters field may be used to determine the location and dimensions of an evaporator shutter. For example, referring to FIG. 5B, an example of a multi-pocket evaporator system in a multi-process IBAD system is shown. Each of the first, second and third processes 302, 304, 306 may include a respective first, second and third multi-pocket evaporator 552, 554, 556. Each evaporator may be configured to hold one or more species. For example, the first process evaporator 552 may be configured to hold species 1A, 1B, 1C . . . 1n. In operation, a multi-pocket evaporator may be configured to include one or more species from a set of species such as Aluminum Oxide (Al2O3), Yttrium Oxide (Y2O3), Yttrium Fluoride (YF3), and Zirconium Oxide (ZrO2). One or more heating/electron beam elements (not shown in FIG. 5B) may be configured to cause the species within the evaporator to evaporate. The first process evaporator 552 includes a first shutter 558 with a first shutter opening 558a. The first shutter 558 is configured to cover one or more of the species such that the species disposed under the opening 558a will evaporate into the first process zone. A second process evaporator 554 and a third process evaporator 556 are similarly situated in the respective second and third process zones. A second evaporator shutter 560, with a second shutter opening 560a, and a third evaporator shutter 562, with a third shutter opening 562a, are operably coupled to the second and third evaporators 554, 556 respectively. The evaporator table 508 may be configured to characterize the evaporator parameters for use with a specific process in the process table 504.

Referring to FIG. 5C, an example table 570 of coating structures generated by a multi-process ion beam assisted deposition system is shown. The entries on the table 570 are examples only and not limitations as other coating structures may be used. The coating structure column indicates a general technical description of the associated process recipe. The Evap 1/Ion 1, Evap 2/Ion 2, and Evap 3/Ion 3 columns indicate the respective evaporator species and ion beam parameters for the respective first, second and third processes 302, 304, 306. The process chamber 301 may include an oxygen backfill gas for each of the example coating systems.

A first coating system 571 includes deposition of Al2O3, Y2O3 and ZrO2 in the respective process zones. The alumina may be used as an adhesion layer to an aluminum substrate, the yttrium oxide may provide electrical isolation, and the zirconia may provide wear resistance and surface stabilization. Each material may be deposited sequentially to create a functional multi-layer film. A second coating system 572 may also include depositions of Al2O3, Y2O3 and ZrO2 but each process may include a multi-pocket evaporator containing each of the species. Thus, each process zone will deposit the same material simultaneously, and then switch materials simultaneously.

A third coating system 573 includes deposition of Y2O3 and YF3. In an example, the first process 302 and the second process 304 may deposit Y2O3 and the third process 306 may deposit YF3. The third evaporator may be shuttered to allow multiple layers of Y2O3 as the substrate makes repeated passes through the first and second process zones, and then the first and second evaporators may be shuttered as the substrate makes repeated passes through the third process zone. The YF3 may be used as a top coat in a multi-layer deposition to provide etching resistance to certain fluorine containing plasmas. In an example, the first and second evaporators may remain open when the third evaporator is opened to create a mixed final layer with Y2O3 and YF3.

A fourth coating system 574 includes deposition of Al2O3, Y2O3 and YF3. The Al2O3 may be deposited in the first process zone while the second and third process zones are shuttered. The first process zone may then be shuttered and the Y2O3 and the YF3 may be deposited when the substrate passes through the second and third zones respectively to form alternating thin layers of Y2O3 and YF3. In an example, each zone may be open sequentially (e.g., one at a time) to allow the substrate to pass repeatedly through a process zone to allow for thicker areas of each material.

A fifth coating systems 575a and 575b are examples of recipes for depositing a Y2O3 coating. The first recipe 575a is an example of a reactive process with Yttrium in each of the evaporators and an oxygen gas in the ion beam. The crystallinity of the Y2O3 coating may be varied by adjusting the beam currents in the process zones. The second recipe 575b utilizes Y2O3 in each of the evaporator chambers.

A sixth coating system 576 includes deposition of Al2O3, Y2O3 and YF3 and forming a functionally graded later between the Al2O3 and the Y2O3, and between the Y2O3 and YF3. For example, the Al2O3 in the first evaporator may be deposited at a full rate (e.g., 2 angstroms per second (Å/s)) and then decreasing the deposition rate while the deposition rate of the Y2O3 in second evaporator increases from zero to the full deposition rate (e.g., 0-2 Å/s). During this first stage, the third evaporator is shuttered. Thus, the first material deposition rate is ramped down while the second material deposition rate is ramped up. Subsequently, in a second stage, the first evaporator may be shuttered and the deposition rate of the Y2O3 in the second evaporator may be ramped down (e.g., 2-0 Å/s) while the deposition rate in the YF3 in the third evaporator is ramped up (e.g., 0-2 Å/s).

A seventh coating system 577 includes the deposition of Al2O3, Y2O3 and YF3 with a boron dopant in the ion beam. A mixture of B2H6 may be mixed with Argon or Oxygen in the ion beam in the third process zone, or as a backfill gas. The first and second evaporators may be shuttered and the first and second ion beams may be secured to allow the boron to be introduced in the final stages of the deposition. In an example, the substrate may be exposed to the final YF3 with boron beam deposition for approximately 5-10 minutes.

An eighth coating system 578 includes the deposition of Al2O3 and ZrO2. The alumina may be deposited while the second and third evaporators are shuttered and the zirconia could be deposited while the first evaporator is shuttered. In an example, all evaporators will remain open and the deposition rate of the alumina may be ramped down from a preset value to zero, while the zirconia deposition rate may be ramped up from zero to a preset value for the consecutive orbits of the substrate through the respective process zones. For example, for each sequential orbit around the process chamber, the deposition rate of the alumina may decrease (as compared to the previous pass) and the deposition rate of the zirconia may increase (as compared to the previous pass). The deposition rates may be a function of the evaporator temperature or, in the case of an electron beam evaporator, the electron beam power. In an example, the deposition rate may be controlled by the dimensions of the shutter opening.

A ninth coating system 579 includes the deposition of Al2O3, ZrO2 and Y2O3. The Al2O3 may be deposited as an adhesion layer while the second and third evaporators are shuttered. In an example, the ZrO2 and the Y2O3 may be deposited as the substrate traverses the second and third process zones. The Zr may be evaporated at a lower rate as compared to the Y2O3 in order to provide some level of incorporation and phase stabilization. In an example, the second and third evaporators may each include Zr and Y2O3 (e.g., multi-pocket evaporator) such that each species is present in each process zone.

A tenth coating system 580 includes the deposition of Y2O3, YF3 and ZrO2-Y2O3. The Y2O3 and YF3 may be functionally graded as previously described while the third evaporator is shuttered. A zirconia stabilized Y2O3 top coating may be deposited as described in the ninth coating system 579 with a multi-pocket third evaporator. In an example, the second process zone with the YF3 may be shuttered and the ZrO2:Y2O3 layer may be achieved by allowing the substrate to repeatedly transit in the first and third process zones.

Figure 6A:
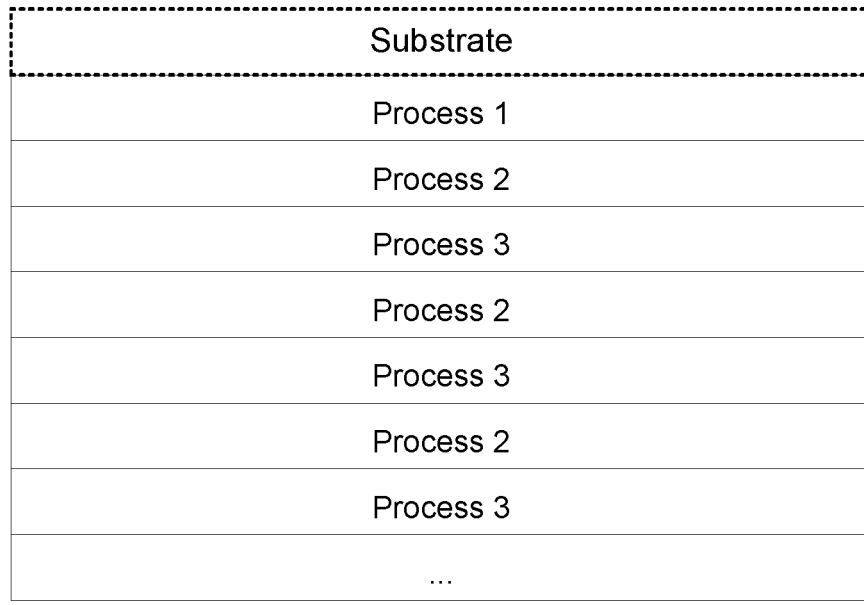
FIGS. 6A-6D are examples of functionally integrated coating structures.
Figure 6B:
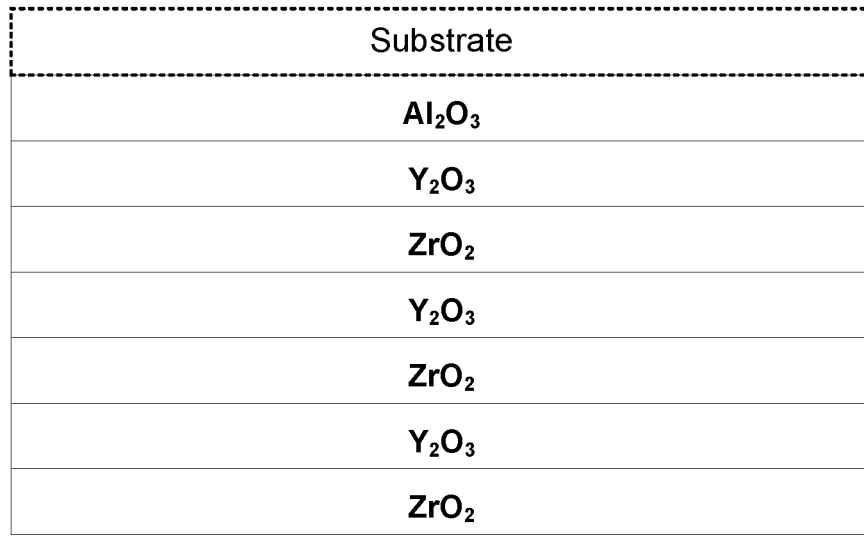
Figure 6C:
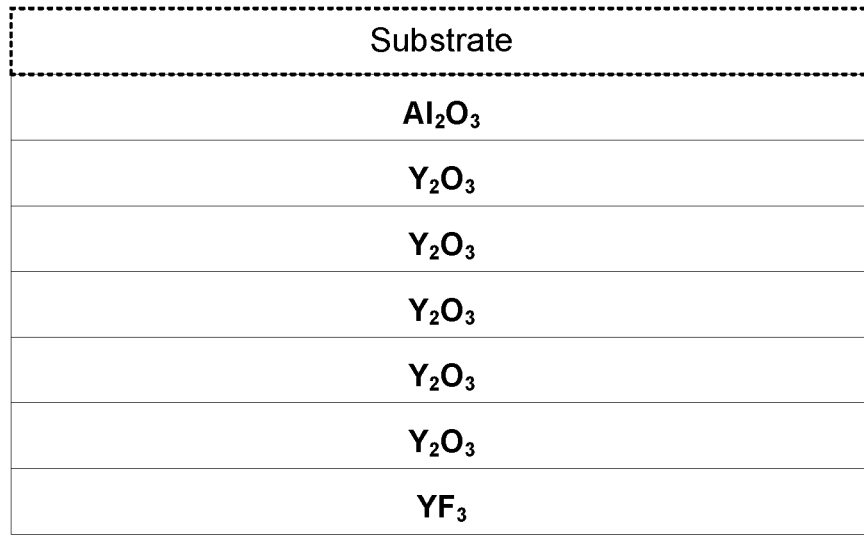
Figure 6D:
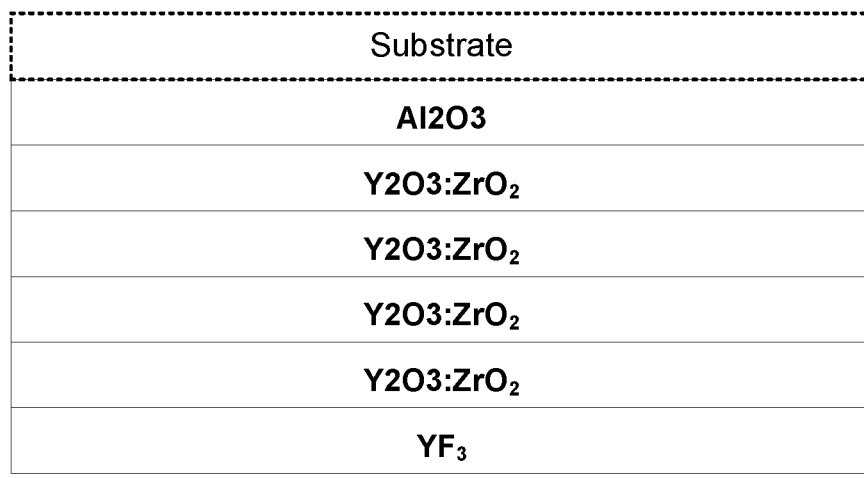

Referring to FIGS. 6A-6D, examples of functionally integrated coating structures are shown. The coating structures are provided to demonstrate the conceptual results of a multi-beam IBAD system. The species, thickness, number and orientation of the layers are exemplary only as other coating structures may be generated by a multi-beam IBAD system. FIG. 6A illustrates how each of the respective first, second and third processes 302, 304, 306 may generate a deposition sequence based on the respective beam source and evaporator species as a substrate is transported through each process zone in the process chamber 301. For example, the first process 302 may be active while the second and third processes 304, 306 are shuttered to form a ceramic coating associated with the first process 302 on a substrate. Subsequently, the first process 302 may be shuttered and the second and third processes 304, 306 may be activated to create respective alternating layers as the substrate is moved through the second and third process zones. FIG. 6B is an example of a functional integrated coating structure based on the ninth coating system 579, including an Al2O3 adhesion layer (e.g., the first process) and either alternating layers of Y2O3 and ZrO2 (e.g., the respective second and third processes) or a single mixed layer containing ZrO2-stabilized Y2O3. FIG. 6C is an example of a functional integrated coating structure based on the fourth coating system 574 including an Al2O3 adhesion layer as a first process, multiple layers of Y2O3 as a second process, and a top layer of YF3 as a third process. FIG. 6D is an example of a functional integrated coating structure based on the ninth and tenth coating systems 579, 580 and includes a Al2O3 adhesion layer as a first process, multiple layers of zirconia phase stabilized Y2O3 as a second process and third process. A top layer of YF3 may be realized by using another pot in the first process evaporator while the second and third evaporators are shuttered (e.g., the first process may be used for both the Al2O3 and the YF3).

In an embodiment, a functional integrated coating may be enhanced with a sintering process following the deposition processes. For example, a post deposition sintering process may be used to reduce voids and changes in the crystal structure to yield a more effective coating on the substrate. The sintering may also increase the atomic mobility of any dopants introduced during the deposition, which may reduce the resistance in the coating (e.g., allow the coating to be closer to a stable ground state) and thus improve the resilience of the coating to a work environment (e.g., heat, plasma, fatigue, etc.). The sinter process may also blunt potential crack propagation throughout the coating.

In an example, a functional integrated coating may be subjected to a cryogenic tempering process after deposition. The substrate and coating may be gradually cooled in liquid nitrogen to temperatures of approximately 300 degrees Fahrenheit below zero to impact the molecular structure of the coating. The cryogenic treatment may be used to tighten up the grain structure in the coating with the effect of increasing the resilience of the coating to the work environment.

Figure 7:
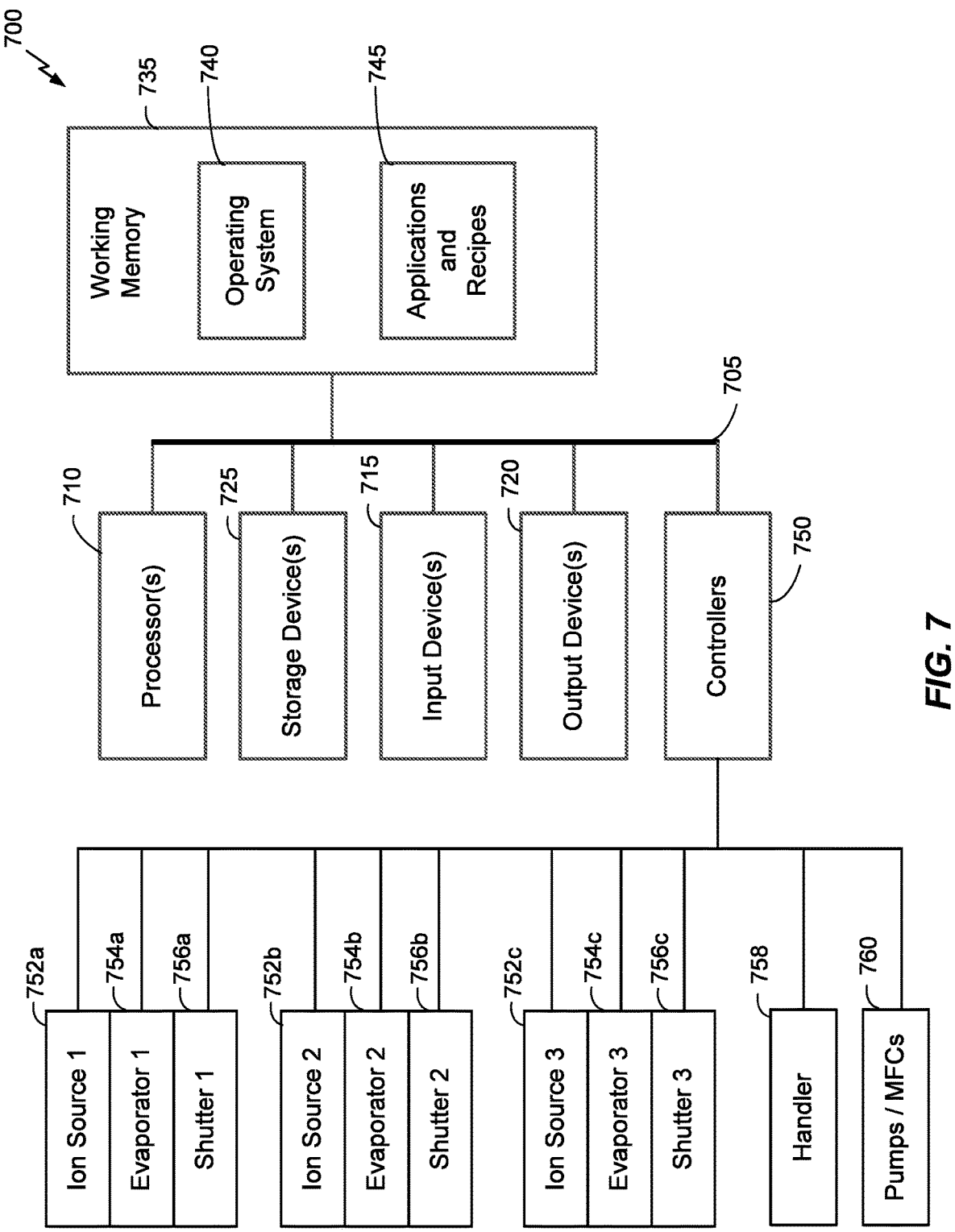
FIG. 7 is a system diagram of an example multi-process ion beam assisted deposition system.

Referring to FIG. 7, with further reference to FIG. 2, a system diagram of an example multi-process ion beam assisted deposition system 700 is shown. FIG. 7 provides a schematic illustration of one embodiment of a multi-process ion beam assisted deposition system 700 that can perform the methods provided by various other embodiments, as described herein. It should be noted that FIG. 7 is meant only to provide a generalized illustration of various components, any or all of which may be utilized as appropriate. FIG. 7, therefore, broadly illustrates how individual system elements may be implemented in a relatively separated or relatively more integrated manner.

The system 700 is shown comprising hardware elements that can be electrically coupled via a bus 705 (or may otherwise be in communication, as appropriate). The hardware elements may include one or more processors 710, including without limitation one or more general-purpose processors and/or one or more special-purpose processors (such as digital signal processing chips, graphics acceleration processors, and/or the like); one or more input devices 715, which can include without limitation a mouse, a keyboard and/or the like; and one or more output devices 720, which can include without limitation a display device, a printer and/or the like.

The system 700 may further include (and/or be in communication with) one or more non-transitory storage devices 725, which can comprise, without limitation, local and/or network accessible storage, and/or can include, without limitation, a disk drive, a drive array, an optical storage device, solid-state storage device such as a random access memory ("RAM") and/or a read-only memory ("ROM"), which can be programmable, flash-updateable and/or the like. Such storage devices may be configured to implement any appropriate data stores, including without limitation, various file systems, database structures, and/or the like.

The system 700 might also include a communications subsystem, which can include without limitation a modem, a network card (wireless or wired), an infrared communication device, a wireless communication device and/or chipset (such as a Bluetooth™ device, an 802.11 device, a WiFi device, a WiMax device, cellular communication facilities, etc.), and/or the like. The communications subsystem may permit data to be exchanged with a network, other computer systems, and/or any other devices described herein. In many embodiments, the system 700 will further comprise a working memory 735, which can include a RAM or ROM device, as described above.

The system 700 also can comprise software elements, shown as being currently located within the working memory 735, including an operating system 740, device drivers, executable libraries, and/or other code, such as one or more application programs and recipe files 745, which may comprise computer programs and data structures provided by various embodiments, and/or may be designed to implement methods, and/or configure systems, provided by other embodiments, as described herein. Merely by way of example, one or more procedures described with respect to the method(s) and data structures described herein might be implemented as code and/or instructions executable by a computer (and/or a processor within a computer).

A set of these instructions and/or code might be stored on a computer-readable storage medium, such as the storage device(s) 725 described above. In some cases, the storage medium might be incorporated within the system 700. In an embodiment, the storage medium might be separate from the system 700 (e.g., a removable medium, such as a compact disc), and/or provided in an installation package, such that the storage medium can be used to program, configure and/or adapt a computer with the instructions/code stored thereon. These instructions might take the form of executable code, which is executable by the system 700 and/or might take the form of source and/or installable code, which, upon compilation and/or installation on the system 700 (e.g., using any of a variety of generally available compilers, installation programs, compression/decompression utilities, etc.) then takes the form of executable code.

The processor(s) 710 may be operably coupled to one or more controllers 750 configured to control the hardware elements in the system 700. The controllers 750 may be motor controllers, programmable logic controllers, motion and position sensors, thermal sensors and control circuits, and other control devices configured to implement process recipes in an ion-beam assisted deposition system. For example, the controllers 750 may be configured to control the first, second and third processes 302, 304, 306. Each of the processes may include the components of the system 200 in FIG. 2. For example, the first process 302 may include a first ion source 752*a*, a first evaporator 754*a*, and a first shutter assembly 756*a*. The second process 304 may include a second ion source 752*b*, a second evaporator 754*b*, and a second shutter assembly 756*a*. The third process 306 may include a third ion source 752*c*, a third evaporator 754*c*, and a third shutter assembly 756*c*. Each of the ion sources 752*a*-*c* may be controlled via respective mass flow controllers 225, ion source power supplies 235, and the extraction power supplies 236. Each of the evaporators 754*a*-*c* may be controlled by a respective evaporator power supply 240. The evaporators 754*a*-*c* and the shutter assemblies 756*a*-*c* may be the respective multi-pocket evaporators and shutters described in FIG. 5B. The shutter assemblies are configured to inhibit the evaporation of the species in the respective evaporators. The controllers 750 may be operably coupled to a handler system 758 configured to transport a substrate into and out of the process chamber 301 and through each of the process zones. The controllers 750 may also be operably coupled to one or more pumps and mass flow controllers (MFCs) 760 and configured to control the process chamber pressure and back fill gas requirements.

It will be apparent to those skilled in the art that substantial variations may be made in accordance with specific requirements. For example, customized controllers and other circuits may also be used, and/or particular elements might be implemented in hardware, software (including portable software, such as applets, etc.), or both. Further, connection to other computing devices such as network input/output devices may be employed.

The coating systems and corresponding recipes stored in the data structure 500 are translated into controller commands in response to processor(s) 710 executing one or more sequences of one or more instructions which might be incorporated into the operating system 740 and/or other code, such as an application programs and recipe information 745 contained in the working memory 735. Such instructions may be read into the working memory 735 from another computer-readable medium, such as one or more of the storage device(s) 725. Merely by way of example, execution of the sequences of instructions contained in the working memory 735 might cause the processor(s) 710 to perform one or more procedures of the methods described herein.

The terms "machine-readable medium" and "computer-readable medium," as used herein, refer to any medium that participates in providing data that causes a machine to operate in a specific fashion. In an embodiment implemented using the system 700, various computer-readable media might be involved in providing instructions/code to processor(s) 710 for execution and/or might be used to store and/or carry such instructions/code (e.g., as signals). In many implementations, a computer-readable medium is a physical and/or tangible storage medium. Such a medium may take many forms, including but not limited to, non-volatile media, volatile media, and transmission media. Non-volatile media include, for example, optical and/or magnetic disks, such as the storage device(s) 725. Volatile media include, without limitation, dynamic memory, such as the working memory 735. Transmission media include, without limitation, coaxial cables, copper wire and fiber optics, including the wires that comprise the bus 705, as well as the various components of the system 700. Common forms of physical and/or tangible computer-readable media include, for example, a floppy disk, a flexible disk, hard disk, magnetic tape, or any other magnetic medium, a CD-ROM, any other optical medium, any other physical medium with patterns of holes, a RAM, a PROM, EPROM, a FLASH-EPROM, any other memory chip or cartridge, a carrier wave as described hereinafter, or any other medium from which a computer can read instructions and/or code.

Figure 8:
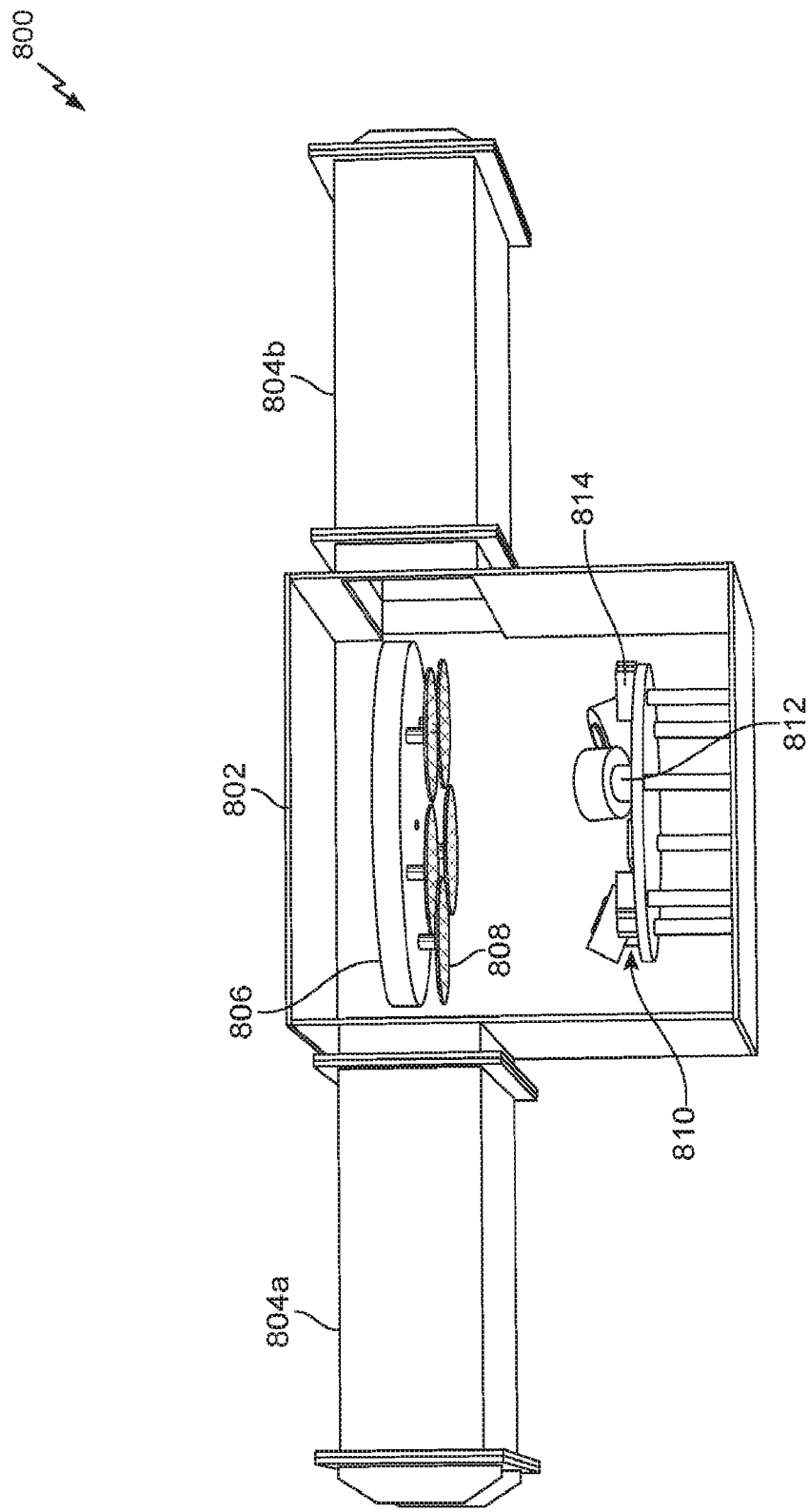
FIG. 8 is a perspective view of an example multi-process ion beam assisted deposition system.

Referring to FIG. 8, with further reference to FIG. 3, a perspective view of an example multi-process ion beam assisted deposition system 800 is shown. The system 800 includes a process chamber 802, an input chamber 804a, and output chamber 804b, a substrate handler 806, one or more substrate holders 808, a first processing zone 810, a second processing zone 812, and a third processing zone 814. The process chamber 802 may be sealed from the input and output chambers 804a-b to allow substrates to loaded and unloaded while the process chamber 802 is in operation. The input and output chambers 804a-b may also be sealed from the environment to allow a vacuum to be maintained in the process chamber 802, as well as facilitate pre and post deposition processing on a substrate and/or the deposited functionally integrated coating structure. In an embodiment, the substrate handler 806 includes one or more disks configured to transverse from the input chamber 804, to the process chamber 802, and then to the output chamber 804b. While in the process chamber 802, the substrate handler 806 is configured to rotate about a first axis such that the substrate holders 808 may pass sequentially over the processing zones 810, 812, 814. In an example, the substrate handler 806 may be configured to accommodate five substrate holders 808. The substrate handler 806 and each of the substrate holders 808 may be operably coupled via a planetary gear system, or other motion system, such that each of the substrate holders 808 is configured to rotate about a holder axis. A holder axis is outboard of the first axis for the substrate handler 806. The ratio between the angular velocity of the substrate handler 806 and the substrate holders 808 may be a range of 5, 10, 20, 50, 100 to 1. That is, a substrate holder 808 may complete 5, 10, 20, 50, or 100 revolutions in a single revolution around the first axis. The number, size, speed and rotation relationship of the substrate holders 808 is exemplary only as other substrate handling solutions may be used based on the dimensions of the substrate and the desired coating.

Figure 9:
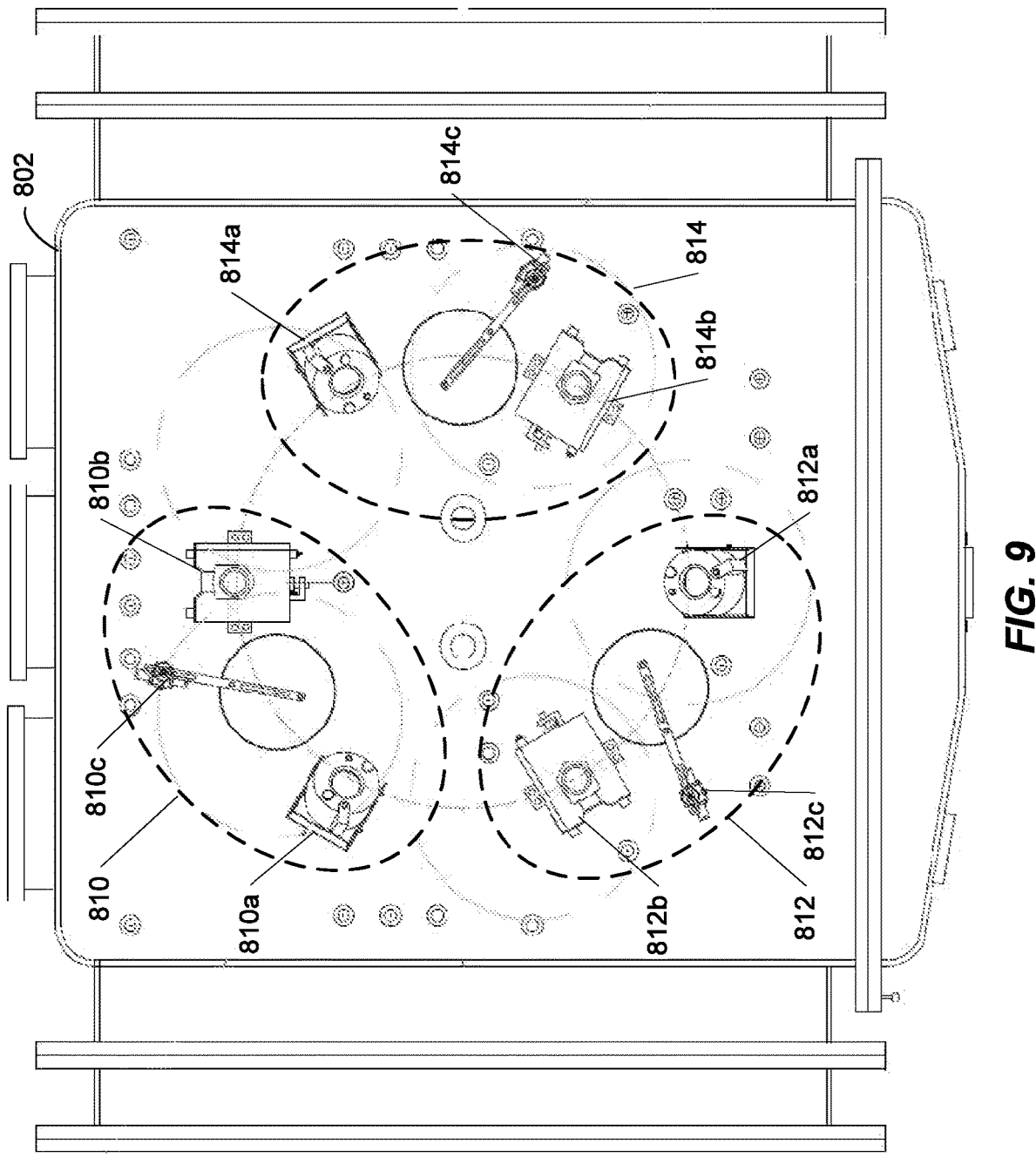
FIG. 9 is a top view of the example multi-process ion beam assisted deposition system of FIG. 8.

Referring to FIG. 9, with further reference to FIG. 8, a top view of the example multi-process ion beam assisted deposition system 800 is shown. The top view provides a perspective of the relative positions of the first process zone 810, the second process zone 812 and the third process zone 814. Each process zone includes a respective ion beam source, evaporator and shutter assembly. For example, the first process zone 810 includes a first ion source 810a, a first evaporator 810b, and a first shutter assembly 810c. The second process zone 812 includes a second ion source 812a, a second evaporator 812b, and a second shutter assembly 812c. The third process zone 814 includes a third ion source 814a, a third evaporator 814b, and a third shutter assembly 814c. The shutter assemblies 810c, 812c, 814c are shown in the open position such that an evaporant may enter the respective process zones. In an example, the shutter assemblies are configured to rotate to dispose a plate over all or a portion of a respective evaporator output to restrict or prohibit an evaporant from entering a process zone. The substrate handler 806 (not shown in FIG. 9) is configured to rotate the substrate holders 808 through the process zones 810, 812, 814. Each of the ion sources, evaporators and shutter assemblies may be configured to perform the coating systems as indicted in FIG. 5C to produce a functionally integrated coating on a substrate.

Figure 10:
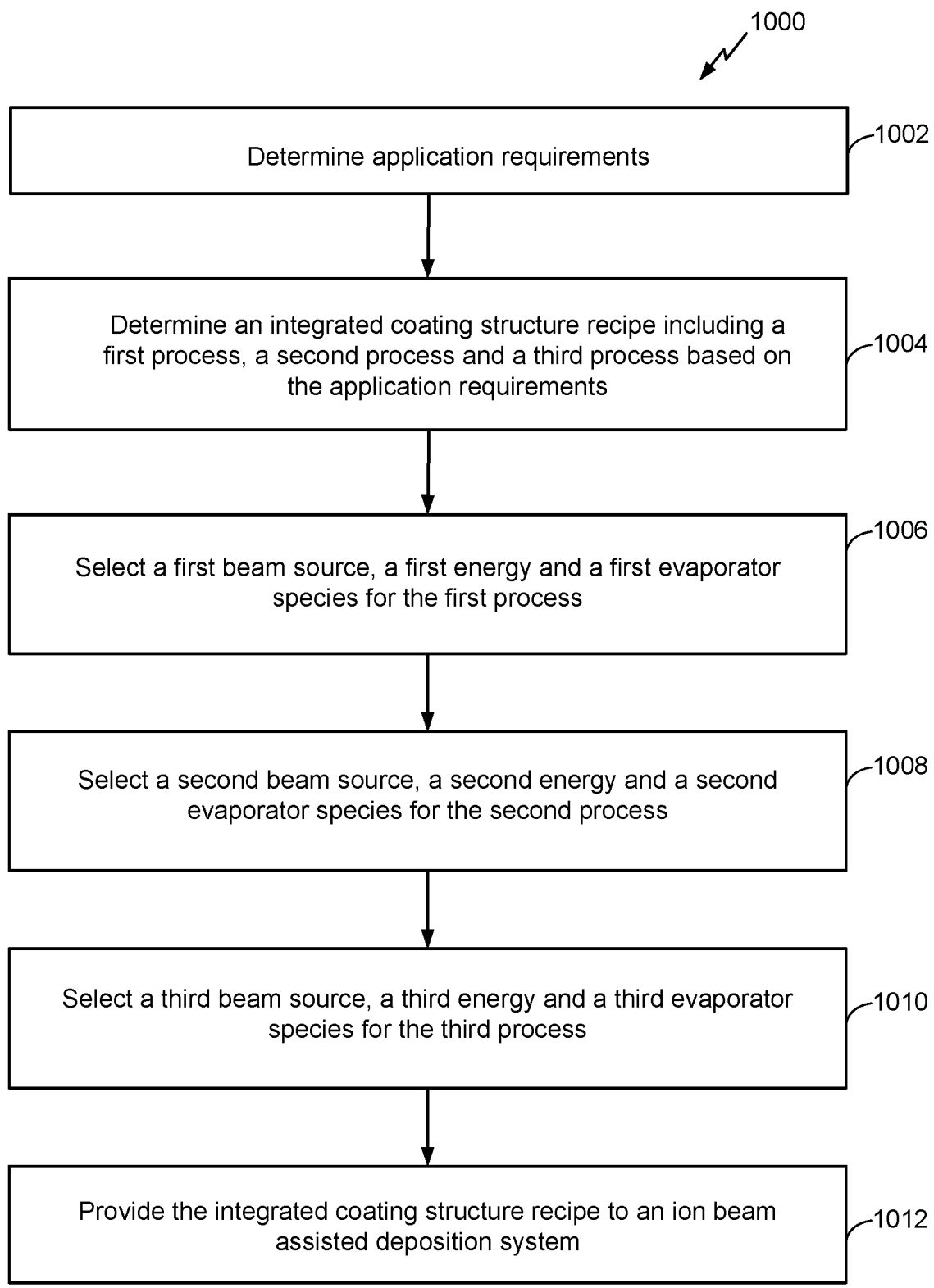
FIG. 10 is an example of a process flow diagram for providing an integrated coating structure recipe to an ion beam assisted deposition system.

Referring to FIG. 10, with further reference to FIGS. 1-9, a method 1000 for providing an integrated coating structure recipe to an ion beam assisted deposition system is shown. The method 1000 is, however, an example only and not limiting. The method 1000 can be altered, e.g., by having stages added, removed, rearranged, combined, performed concurrently and/or having stages split into multiple stages.

At stage 1002, the method includes determining application requirements for a ceramic coating. The application requirements may be based on the material composition of a substrate and the expected environment the coated substrate will operate in. The applications and associated coating requirements may vary significantly. For example, high wear applications may include formations of Al2O3 and ZrO2. High temperature applications may use a ceramic thermal barrier coating (TBC) including an aluminide such as NiAl or Ni2Al3. An ESC in a plasma processing system may utilize ceramic coatings such as Y2O3. Other applications may have new or similar requirements.

At stage 1004, the method includes determining an integrated coating structure including a first process, a second process and a third process based on the application requirements. For purposes of explanation, a plasma processing component such as an aluminum ESC will be used as an example of an application requirement. Since the ESC is and aluminum substrate that will be exposed to certain types of fluorine plasmas, a coating system such as the fourth coating system 574 as depicted in FIG. 6C is selected. The fourth coating system 574 utilizes a first process of Al2O3 to create an adhesion layer on the substrate. A second process including Y2O3 will be used to provide isolation from the plasma, and a third process including YF3 to provide etch resistance to plasmas containing fluorine.

At stage 1006, the method includes selecting a first beam source, a first energy and a first evaporator species for the first process. The system 700 may include a user interface based on the data structure 500. A user may select or create a recipe for the ESC coating application to indicate a backfill gas for the process chamber 802 (e.g., O2) and the desired processes (e.g., process 1, process 2, process 3). The user may also indicate recipe appropriate handling speed, duration and shutter pattern information. In this example, as indicated in FIG. 5C, the first beam source is an Argon beam with a current density of 90 $\mu A/cm^2$ and ion beam energy of 500 eV, and the first evaporator species is Al2O3 at deposition rate of 2 Å/s.

At stage 1008, the method includes selecting a second beam source, a second energy and a second evaporator species for the second process. Continuing the ESC example, the user may select the second process (e.g., process 2) in the recipe table such that the second beam source is an Argon beam with a current density of 90 $\mu A/cm^2$ and ion beam energy of 500 eV, and the second evaporator species is Y2O3 at deposition rate of 2 Å/s.

At stage 1010, the method includes selecting a third beam source, a third energy and a third evaporator species for the third process. As indicated in FIG. 5C, the user may select the third process (e.g., process 3) in the recipe table such that the third beam source is an Argon beam with a current density of 90 $\mu A/cm^2$ and ion beam energy of 500 eV, and the third evaporator species is YF3 at deposition rate of 2 Å/s.

At stage 1012, the method includes providing the integrated coating structure recipe to an ion beam assisted deposition system. The processor(s) and the working memory 735 are configured to provide control signals to the controllers 750 based on the first, second and third processes. For example, the controllers 750 may activate mass flow controllers and extraction power supplies based on the desired beams and energy. Evaporator power supplies and shutter assemblies may be controlled based on a process species and deposition rate. In an example, an integrated coating structure recipe may be generated on a first multi-process ion beam assisted deposition system and transferred to a second multi-process ion beam assisted deposition system (e.g., recipe sharing).

Figure 11:
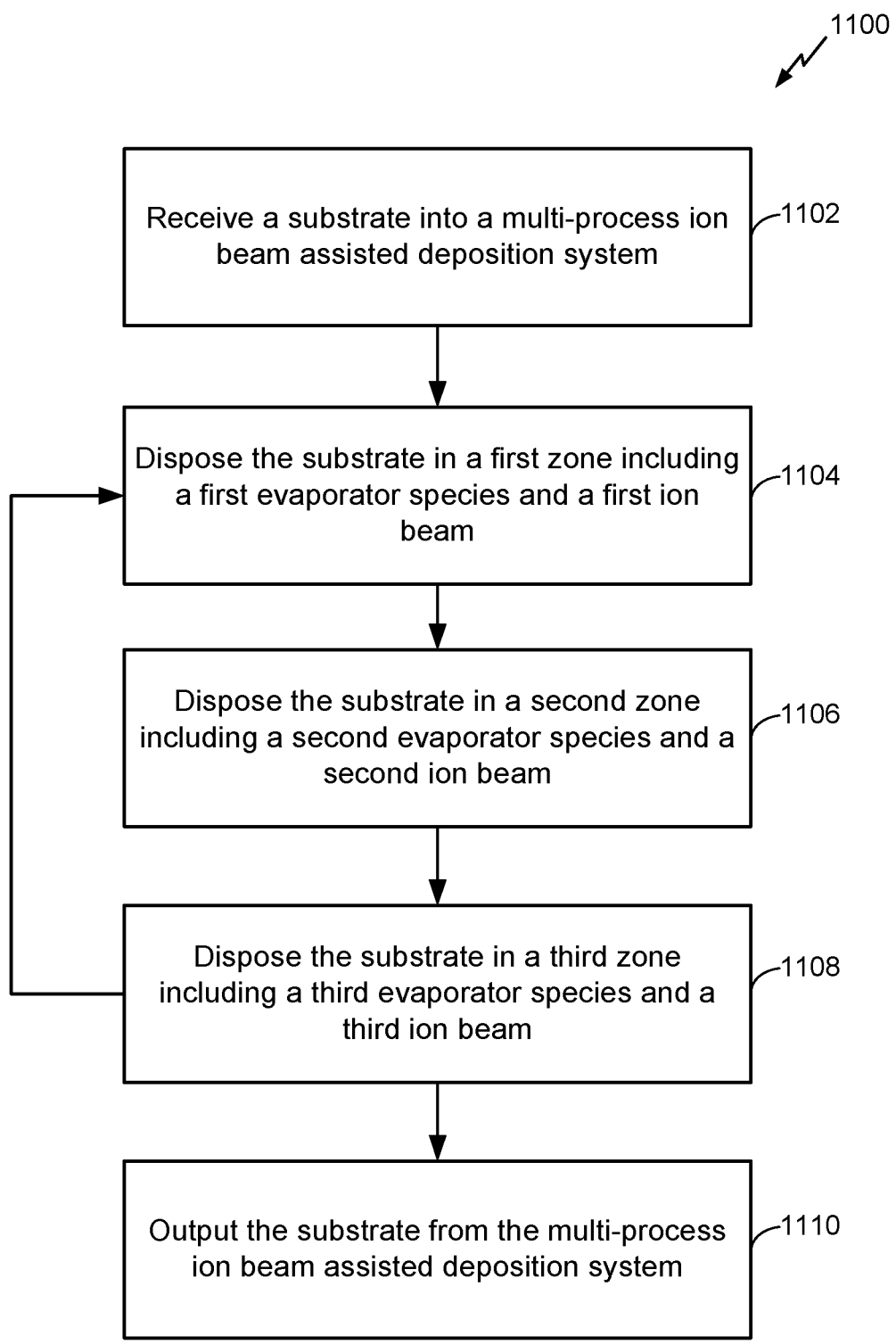
FIG. 11 is an example of a process flow diagram for generating a functional integrated coating structure.

Referring to FIG. 11, with further reference to FIGS. 1-10, an example of a method 1100 for generating a functional integrated coating structure is shown. The method 1100 is, however, an example only and not limiting. The method 1100 can be altered, e.g., by having stages added and/or having a stage split into multiple stages.

At stage 1102, the method includes receiving a substrate into a multi-process ion beam assisted deposition system. The system 800 includes a substrate handler 806 with one or more substrate holders 808. One or more substrates, such as turbine blades, drill bits, wafer chucks, or other items may be disposed on the substrate holders 808. The substrate handler 806 may be positioned in the process chamber 802 such that the substrates will traverse through each of the three process zones 810, 812 and 814 as the substrate handler 806 rotates about a first axis.

Figure 5B:
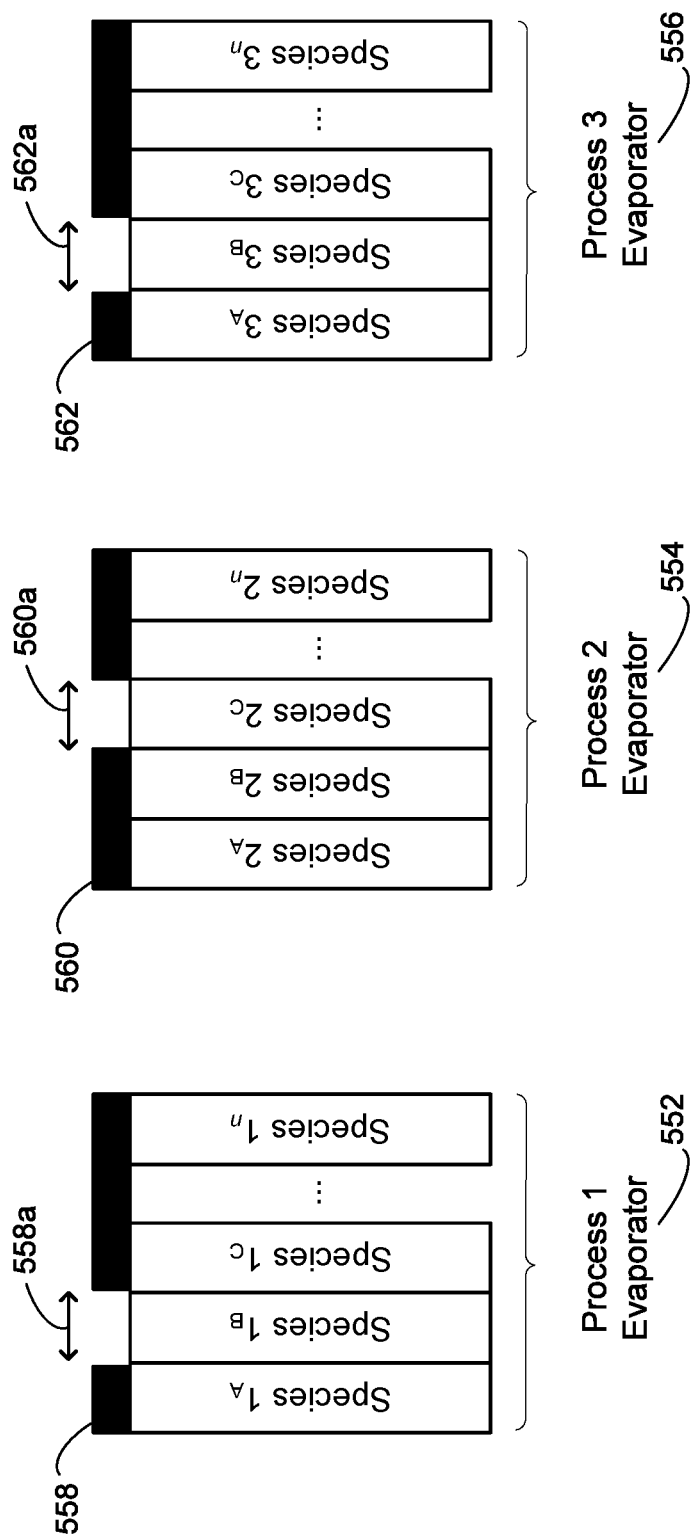
FIG. 5B is an example of a multi-pocket evaporator system.

At stage 1104, the method includes disposing the substrate in a first zone including a first evaporator species and a first ion beam. The substrate handler 806 may be configured to continuously rotate the substrate through the first, second and third process zones. For example, the substrate handler 806 is configured to rotate the substrate (and the substrate holder 808) through the first process zone 810. The first process zone 810 includes a first ion source 810a, a first evaporator 810b and a first shutter assembly 810c. The first evaporator species may be based on a selected recipe such as depicted in FIG. 5A. For example, the species table 514 includes options for metallic and ceramic species. Multiple species may be selected when the first evaporator 810b is a multi-pocket evaporator such as depicted in FIG. 5B. The first ion beam may be selected from the beam gas table 510 and a beam energy may be established based on an ion source power supply and an extraction voltage. The first beam may include a dopant from the dopant table 512.

At stage 1106, the method includes disposing the substrate in a second zone including a second evaporator species and a second ion beam. The substrate handler 806 is configured to rotate the substrate (and the substrate holder 808) from the first process zone 810 and into the second process zone 812. The second process zone 812 includes a second ion source 812a, a second evaporator 812b and a second shutter assembly 812c. The second evaporator species may also be based on the selected recipe such that the second species is selected from the species table 514. The second evaporator 812b may be a multi-pocket evaporator such as depicted in FIG. 5B. The second ion beam may be selected from the beam gas table 510 and the corresponding beam energy may be established based on respective second ion source power supply and extraction voltages. The second beam may include a dopant from the dopant table 512. The second evaporator species and the second ion beam may be the same values as the first evaporator species and the first ion beam.

At stage 1108, the method includes disposing the substrate in a third zone including a third evaporator species and a third ion beam. The substrate handler 806 is configured to rotate the substrate (and the substrate holder 808) from the second process zone 812 and into the third process zone 814. The third process zone 814 includes a third ion source 814a, a third evaporator 814b and a third shutter assembly 814c. The third evaporator species may also be based on the selected recipe such that the third species is selected from the species table 514. The third evaporator 814b may be a multi-pocket evaporator such as depicted in FIG. 5B. The third ion beam may be selected from the beam gas table 510 and the corresponding beam energy may be established based on respective third ion source power supply and extraction voltages. The third beam may include a dopant from the dopant table 512. The third evaporator species and the third ion beam may be the same values as either the first or second evaporator species and the first or second ion beams. The substrate handler 806 is configured to move the substrate from the third process zone 814 and back into the first substrate zone 810 and thus repeating the cycle. The respective first, second and third shutter assemblies may be activated to restrict or prohibit evaporants from entering the process zones. The ion beams may also be reduced or shielded to prevent an ion beam from entering a process zone.

At stage 1110, the method includes outputting the substrate from the multi-process ion beam assisted system. The substrate handler 806 is configured to traverse from the process chamber 802 to the output chamber 804b. In an example, the output chamber 804b may be placed under a vacuum and a chamber door between the process chamber 802 and the output chamber 804b may be opened without loss of vacuum to the process chamber 802. In an embodiment, the output chamber 804b may include one or more heating elements configured to heat the substrate and coating in a post deposition sintering process. The sintering process may be used to reduce voids and changes in the crystal structure to yield a more effective coating on the substrate. The sintering may also increase the atomic mobility of any dopants introduced during the deposition, which may reduce the resistance in the coating (e.g., allow the coating to be closer to a stable ground state) and thus improve the resilience of the coating to a work environment (e.g., heat, plasma, fatigue, etc.). The sinter process may also blunt potential crack propagation throughout the coating.

The methods, systems, and devices discussed above are examples and other embodiments are within the scope of the invention. Various alternative configurations may omit, substitute, or add various procedures or components as appropriate. Configurations may be described as a process which is depicted as a flow diagram or block diagram. Although each may describe the operations as a sequential process, many of the operations can be performed in parallel or concurrently. In addition, the order of the operations may be rearranged. A process may have additional stages not included in the figure.

Specific details are given in the description to provide a thorough understanding of example configurations (including implementations). However, configurations may be practiced without these specific details. For example, well-known processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional stages or functions not included in the figure.

Having described several example configurations, various modifications, alternative constructions, and equivalents may be used without departing from the disclosure. For example, the above elements may be components of a larger system, wherein other rules may take precedence over or otherwise modify the application of the invention. Also, a number of operations may be undertaken before, during, or after the above elements are considered. Also, technology evolves and, thus, many of the elements are examples and do not bound the scope of the disclosure or claims. Accordingly, the above description does not bound the scope of the claims. Further, more than one invention may be disclosed.

As used herein, including in the claims, "or" as used in a list of items prefaced by "at least one of" or "one or more of" indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.). Also, as used herein, unless otherwise stated, a statement that a function or operation is "based on" an item or condition means that the function or operation is based on the stated item or condition and may be based on one or more items and/or conditions in addition to the stated item or condition. As used herein, including in the claims, unless otherwise stated, a statement that a function or operation is "based on" an item or condition means that the function or operation is based on the stated item or condition and may be based on one or more items and/or conditions in addition to the stated item or condition.

What is claimed is:

1. A method of depositing a functionally integrated coating structure on a substrate, comprising:
   receiving the substrate into a process chamber of a multi-process ion beam assisted deposition system;
   disposing the substrate in a first zone including a first evaporator species and a first ion beam, wherein the first evaporator species is Aluminum Oxide (Al2O3) at a deposition rate of between 1 and 10 angstroms per second and the first ion beam includes an Argon or Oxygen gas at an energy between 500 and 2000 electronvolts and a current density between 50 and 150 micro-amps per square centimeter;
   disposing the substrate in a second zone including a second evaporator species and a second ion beam, wherein the second evaporator species is Yttrium Oxide (Y2O3) at a deposition rate of between 1 and 10 angstroms per second and the second ion beam includes an Argon or Oxygen gas at an energy between 500 and 2000 electronvolts and a current density between 50 and 150 micro-amps per square centimeter;
   disposing the substrate in a third zone including a third evaporator species and a third ion beam, wherein the third evaporator species is Yttrium Fluoride (YF3) at a deposition rate of between 1 and 10 angstroms per second and the third ion beam includes an Argon or Oxygen gas at an energy between 500 and 2000 electronvolts and a current density between 50 and 150 micro-amps per square centimeter;
   securing the second ion beam;
   disposing a second shutter assembly over the second evaporator species, wherein the second shutter assembly is configured to inhibit the evaporation of the second evaporator species;
   securing the third ion beam;
   disposing a third shutter assembly over the third evaporator species, wherein the third shutter assembly is configured to inhibit the evaporation of the third evaporator species;
   wherein disposing the substrate in the first zone, disposing the substrate in the second zone and disposing the substrate in the third zone includes orbiting the substrate for a plurality of consecutive orbits through each of the first zone, the second zone and the third zone;
   activating the second ion beam;
   disposing the second shutter assembly away from the second evaporator species, wherein the second shutter assembly does not inhibit the evaporation of the second evaporator species;
   increasing the deposition rate in the second zone from zero angstroms per second to 1 to 10 angstroms per second, wherein the deposition rate in the second zone increases relative to the consecutive orbits of the substrate through the second zone;
   decreasing the deposition rate in the first zone from 1 to 10 angstroms per second to less than 0.1 angstroms per second, wherein the deposition rate in the first zone decreases relative to the consecutive orbits of the substrate through the first zone;
   securing the first ion beam; and
   disposing a first shutter assembly over the first evaporator species, wherein the first shutter assembly is configured to inhibit the evaporation of the first evaporator species.

2. The method of claim 1 further comprising outputting the substrate from the process chamber of the multi-process ion beam assisted deposition system.

3. The method of claim 1 further comprising:
   activating the third ion beam;
   disposing the third shutter assembly away from the third evaporator species, wherein the third shutter assembly does not inhibit the evaporation of the third evaporator species;
   increasing the deposition rate in the third zone from zero angstroms per second to 1 to 10 angstroms per second, wherein the deposition rate in the third zone increases relative to consecutive orbits of the substrate through the third zone;
   decreasing the deposition rate in the second zone from 1 to 10 angstroms per second to less than 0.1 angstroms per second, wherein the deposition rate in the second zone decreases relative to consecutive orbits of the substrate through the second zone;
   securing the second ion beam; and
   disposing the second shutter assembly over the second evaporator species to inhibit the evaporation of the second evaporator species.

4. The method of claim 1 wherein the substrate is an electrostatic chuck for a plasma processing chamber.

5. The method of claim 1 further comprising providing an oxygen backfill gas to the process chamber.

* * * * *